United States Patent [19]
Miyashita et al.

[11] Patent Number: 6,086,710
[45] Date of Patent: Jul. 11, 2000

[54] SURFACE TREATMENT APPARATUS

[75] Inventors: Takeshi Miyashita; Takuya Miyakawa; Yasutugu Aoki; Isao Kubota; Osamu Kurashina; Yasuhiko Asano; Yoshio Oda; Yoshiaki Mori, all of Nagano-ken, Japan

[73] Assignee: Seiko Epson Corporation, Tokyo, Japan

[21] Appl. No.: 08/750,397

[22] PCT Filed: Apr. 5, 1996

[86] PCT No.: PCT/JP96/00935

§ 371 Date: Dec. 6, 1996

§ 102(e) Date: Dec. 6, 1996

[87] PCT Pub. No.: WO96/31997

PCT Pub. Date: Oct. 10, 1996

[30] Foreign Application Priority Data

Apr. 7, 1995  [JP]  Japan ................................. 7-107107

[51] Int. Cl.⁷ ............................ H05H 1/46; H01L 21/302
[52] U.S. Cl. ......................................................... 156/345
[58] Field of Search ........................... 118/723 R, 723 E, 118/718; 156/345; 204/298.34

[56] References Cited

U.S. PATENT DOCUMENTS

| | | | |
|---|---|---|---|
| 3,730,873 | 5/1973 | Pompei et al. ................ | 204/298.34 X |
| 3,762,941 | 10/1973 | Hou ............................. | 117/93.1 |
| 4,012,307 | 3/1977 | Phillips ....................... | 204/192 |
| 4,380,488 | 4/1983 | Reichelderfer et al. ...... | 156/345 X |
| 4,430,547 | 2/1984 | Yoneda et al. .............. | 219/121 |
| 4,491,496 | 1/1985 | Laporte et al .............. | 156/345 |
| 4,705,593 | 11/1987 | Haigh et al. ................ | 156/635 |
| 4,708,766 | 11/1987 | Hynecek ..................... | 156/643 |
| 4,749,440 | 6/1988 | Blackwood et al. .......... | 156/646 |
| 4,857,382 | 8/1989 | Liu et al. .................... | 428/156 |
| 4,921,157 | 5/1990 | Dishon et al. .............. | 228/124 |
| 5,000,819 | 3/1991 | Pedder et al. .............. | 156/643 |
| 5,045,166 | 9/1991 | Bobbio ........................ | 204/192 |
| 5,113,790 | 5/1992 | Geisler et al. .............. | 118/723 E |
| 5,120,568 | 6/1992 | Schuurmans et al. ....... | 427/37 |
| 5,126,164 | 6/1992 | Okazaki et al. ............. | 427/39 |
| 5,147,520 | 9/1992 | Bobbio ........................ | 204/192 |
| 5,178,682 | 1/1993 | Tsukamoto et al. ......... | 118/722 |
| 5,201,995 | 4/1993 | Reisman et al. ............ | 156/646 |

(List continued on next page.)

FOREIGN PATENT DOCUMENTS

| | | |
|---|---|---|
| 0371693 | 6/1990 | European Pat. Off. . |
| 59-158525 | 9/1984 | Japan . |
| 60-1862 | 1/1985 | Japan . |
| 91-127866 | 6/1986 | Japan . |
| 2-190489 | 7/1990 | Japan . |
| 2-281734 | 11/1990 | Japan . |
| 3-174972 | 7/1991 | Japan . |
| 3-219082 | 9/1991 | Japan . |
| 3-236475 | 10/1991 | Japan . |
| 4-186619 | 7/1992 | Japan . |
| 5-82478 | 4/1993 | Japan . |
| 6-2149 | 1/1994 | Japan . |
| 6-190269 | 7/1994 | Japan . |

*Primary Examiner*—Thi Dang
*Attorney, Agent, or Firm*—Stroock & Stroock & Lavan LLP

[57] ABSTRACT

In a surface treatment apparatus (30) of the face type, a porous dielectric (37) is supported by the outer periphery portion of the supporting member (45) under the bottom surface of a porous electrode (32). The dielectric can be supported by the supporting member to permit the thermal expansion deformation of the dielectric by forming an upward inclined-face (47) and a downward inclined-face (43) on the supporting member (45) and the dielectric (37), respectively. Further, a discharge gas can be supplied uniformly to a discharge region (51) through the electrode (32) and the dielectric (37), both of which are porous. Many gas exhaust ports (41), by which the flow rate of the gas can be regulated, are provided around the discharge region (51). Thus, the gas is uniformly exhausted around the discharge region (51). Especially, if the gap between the dielectric (37) and a work (39) depends on mounting accuracy or the like and varies with location, the gas can be exhausted uniformly around the discharge region (51).

18 Claims, 14 Drawing Sheets

U.S. PATENT DOCUMENTS

| | | | |
|---|---|---|---|
| 5,225,659 | 7/1993 | Kusano et al. | 249/121 |
| 5,240,559 | 8/1993 | Ishida | 456/666 |
| 5,290,378 | 3/1994 | Kusano et al. | 156/272 |
| 5,292,370 | 3/1994 | Tsai et al. | |
| 5,316,739 | 5/1994 | Yoshikawa et al. | |
| 5,340,618 | 8/1994 | Tanisaki et al. | |
| 5,368,685 | 11/1994 | Kumihashi et al. | |
| 5,384,167 | 1/1995 | Nishiwaki et al. | |
| 5,391,855 | 2/1995 | Tanisaki | |
| 5,399,830 | 3/1995 | Maruyama | |
| 5,407,121 | 4/1995 | Koopman et al. | |
| 5,413,671 | 5/1995 | Ketchum | 156/345 X |
| 5,449,432 | 9/1995 | Hanawa | |
| 5,499,754 | 3/1996 | Bobbio et al. | |
| 5,522,934 | 6/1996 | Suzuki et al. | 118/723 R X |
| 5,560,777 | 10/1996 | Ahn | 118/723 E |
| 5,567,255 | 10/1996 | Steinberg | 156/345 |
| 5,597,438 | 1/1997 | Grewal et al. | |
| 5,609,290 | 3/1997 | Bobbio et al. | 228/206 |
| 5,660,673 | 8/1997 | Miyoshi | 156/345 |
| 5,728,224 | 3/1998 | Laurent et al. | 118/718 |

SURFACE TREATMENT APPARATUS

[TECHNICAL FIELD]

The present invention relates to an apparatus for treating a surface of a workpiece, which is to be treated, by utilizing a plasma. For example, in semiconductor fabrication, the present invention is used for etching and ashing a surface of a workpiece, or for performing surface modification on a workpiece, and for performing thin film deposition.

[BACKGROUND ART]

Heretofore, in various fields, there have been utilized techniques for variously treating a surface of a workpiece by using a plasma in this way. Conventional plasma surface treatment methods have problems in that generally, special equipment and facilities, such as a vacuum chamber, are required to cause a plasma discharge in a reduced pressure environment, the performance of a surface treatment is low and it is difficult to treat a surface of a large area. As a result, the manufacturing cost becomes high. Thus, recently, there have been proposed surface treatment techniques as described in, for example, the Japanese Patent Application No. 6-2149 Official Gazette, which can obviate the necessity of a vacuum facility and can simplify and miniaturize the equipment and enable the treatment of a surface of a large area at a low cost.

An example of a conventional apparatus for treating a surface of a large area by using an atmospheric-pressure plasma in this way is schematically illustrated in FIG. 12. This surface treatment apparatus 1 has a disk-like upper electrode 3 and a disk-like lower electrode 6 which are placed a certain distance apart in parallel with each other in a housing 2. The lower electrode 6 is grounded and a workpiece to be treated 4 is put thereon over a dielectric 5. The upper electrode 3 is connected to a power supply 7, and a porous dielectric 8 is placed thereunder so as to do away with an abnormal discharge and obtain uniform distribution of a discharge gas. A discharge is caused between both of the electrodes by applying a predetermined voltage to the upper electrode 3 from the power supply 7.

The upper electrode 3 is provided with many air holes (not shown) bored therein in such a manner as to provide an opening to the dielectric 8. Gas supplied from an external gas supply 10 to a chamber 9 defined therein is introduced through the air holes the dielectric 8 into a discharge region 11 in the housing 2. The gas is dispersed by the porous dielectric 8 and is supplied uniformly to the entire discharge region, so that a plasma is uniformly produced in the discharge region 11. The surface of the workpiece 4 is treated by exposing excited active species of the gas generated from this plasma. The gas flows from the periphery of the discharge region 11 to the bottom side of the upper electrode 6 and is then exhausted from a gas exhaust port 12 provided in the central part of the bottom portion of the housing 2, as indicated by arrows in FIG. 12.

FIG. 13 schematically illustrates another conventional surface treatment apparatus 13. This surface treatment apparatus 13 is different from the aforementioned surface treatment apparatus of the face type and is what is called a line type that treats the surface of the workpiece, which relatively moves just thereunder, while scanning the surface thereof. Further, this surface treatment apparatus 13 has an elongated electrode 14 extending in a direction indicated by an arrow A in this figure, which is orthogonal to the direction of the movement of the workpiece. Two discharge generating portions 15 and 16 of the same size and shape are provided on the bottom surface of the electrode 14 in such a way as to extend in parallel with each other over the full length of the electrode 14 and project downwardly from the bottom surface thereof. Further, a dielectric 18 is fitted to the bottom portion of the electrode 14 between both of the discharge generating portions in such a way as to define an intermediate chamber 17 over the full length of the electrode 14. Gas ejecting ports 19, each of which opens downwardly from the intermediate chamber 17, are linearly formed in the dielectric 18 over the full length of the electrode 14. Further, gas inlets 20 opening upwardly in the top surface of the electrode 14 communicate with the intermediate chamber 17. When a predetermined voltage is applied to the electrode 14, an electric discharge is caused among both of the discharge generating portions 15 and 16 and the workpiece which pass through thereunder. Gas supplied from the external gas supply through the gas inlets 20 into the intermediate chamber 17 is ejected from the gas ejecting ports 19 downwardly to the workpiece and is then introduced into the plasma produced by the discharge. Thus, excited active species are generated to thereby treat the surface of the workpiece.

However, in the apparatuses of FIGS. 12 and 13, the following problems have arisen. First, in the case of the conventional surface treatment apparatus of FIG. 12, the porous dielectric 8 is directly fixed to the housing by fixation means such as screws 21. Thus, there are concerns that cracks and warpage are caused by local stress caused therein and thermal stress, owing to the high temperature of a plasma discharge; and that if a crack or warpage occurs in the porous dielectric 8, the desired function of uniformly distributing the gas over the discharge region cannot be performed; conversely, if the output of the power supply is suppressed in order to prevent the temperature of the discharge plasma from becoming excessively high, a sufficient discharge is not obtained, the performance of a surface treatment is lowered and thus the treatment rate becomes reduced or the surface treatment is not sufficiently achieved; and that further, if a crack is produced in the dielectric 8, the function of preventing an occurrence of an abnormal discharge, which is the essential function of the dielectric 8, is impaired.

Further, in the case of this conventional apparatus, even though the distribution of the gas in the discharge region is made to be uniform by using the porous dielectric, the exhaust is performed only from the single gas exhaust port provided on the back side of the lower electrode, as above described. Thus, when a certain gap between the dielectric 8 and the workpiece to be treated is not maintained owing to a mounting error or the like of the apparatus, there are concerns that a deviation or deflection of a gas flow is caused, that an irregularity or nonuniformity is caused in the distribution of the gas in the discharge region 11 and that the entire workpiece cannot be treated uniformly. Further, there are additional concerns that organic substances and the like removed from the workpiece can be redeposited thereon during ejection from the discharge region and that thus, the workpiece can become contaminated and the maintenance of the apparatus can be difficult.

Moreover, it is favorable for realizing a uniform distribution of the gas that a porous plate is used as the upper electrode 3 instead of providing many air holes therein. In contrast, in the case of using a carbon material or SUS base material, such a material reacts with gases such as $O_2$ and $CF_4$, so that oxidization and corrosion are liable to occur. Therefore, there is a concern that a detached material from the electrode can contaminate the surface of the workpiece and the interior of the apparatus. Especially, in the case that the workpiece to be treated is a silicon wafer, metal contamination by, for example, Fe can be a problem. Furthermore, the need for periodic replacement of such an electrode material arises from the fact that such an electrode material is a consumable good. As a result, the operating cost is increased. Eventually, the cost of the apparatus becomes high.

Further, in the case of the conventional surface treatment apparatus of FIG. 13, it is difficult to cause an electric discharge uniformly in the longitudinal direction of the electrode under near atmospheric pressure even if the width of the discharge generating portion is made to be uniform, which is different from the case of a vacuum discharge. Moreover, because of the problem of an abnormal discharge, there is a limit to the power for causing an electric discharge. A discharge area, which depends upon the width of the discharge generating portion, results in a fixed certain range of the discharge region. Thus, neither the enlargement of the discharge region nor the regulation or enhancement of the performance of the surface treatment can be performed according to treatment conditions. Consequently, especially, in the case of treatment of a large area, it is difficult to achieve a uniform treatment. Moreover, the realization of high-speed treatment cannot be expected.

Furthermore, the intermediate chamber 17 is used for making uniform the pressure of the gas supplied from the gas inlets 20 of a limited number in the longitudinal direction of the electrode, to thereby cause the gas to be uniformly ejected from the full length of the gas ejecting ports 19. However, because of the fact that each of the gas ejecting ports 19 and a corresponding one of the gas inlets 20 are placed in line, most of the gas introduced from each of the gas in lets 20 flows directly into the corresponding gas ejecting port 19. Thus, there are concerns that the distribution of the gas ejected in the longitudinal direct ion of the electrode becomes nonuniform and that uniform surface treatment cannot be achieved and consequently, the enhancement of the treatment performance cannot be accomplished.

Besides, in the case of this conventional apparatus, the gas supplied from the gas ejecting ports 19 to the discharge region is exhausted by being easily dispersed into the air from the front and rear of the electrode when viewed from the direction of the movement of the workpiece. Regarding the gas, helium, which is relatively expensive, is mixed in to reactive gas in order to stabilize the electric discharge. This conventional apparatus, however, has a problem in that when the flow rate of helium is increased correspondingly to the dispersion of the gas, the treatment cost is increased considerably. Further, there are concerns that because air is mixed in the discharge region when the gas is dispersed, that the discharge will become unstable, or the organic substances or the like, which have been removed, will react with impurities contained in the air and become redeposited onto the surface of the workpiece. To effectively prevent this and stabilize the discharge, the apparatus requires an appropriate exhaust mechanism to reduce the concentration of gaseous impurities which a recontained in the air, in the discharge region. Moreover, from the viewpoint of environments protection, it is necessary to suitably treat the exhaust gas, including ozone or the like, which is generated by the plasma discharge.

Furthermore, in the case of such a surface treatment apparatus, regardless of the electrode configuration, even when the dielectric for protecting the electrode is provided therein, there are concerns that abnormal discharges such as an arc discharge are caused and thus, that the workpiece and a stage on which the workpiece is placed, will be damaged. Consequently, such an apparatus has problems in that the output thereof is limited, that therefore, the treatment performance cannot be sufficiently enhanced and neither high-speed treatment nor reduction in cost can be achieved.

Thus, the pre sent invention is accomplished in view of the aforementioned problems of the prior art. An object of the present invention is to provide a surface treatment apparatus, which is called the face type, adapted so that the gas supplied to the discharge region passes through the plate-like electrode so as to perform a surface treatment by using a plasma generated under a near atmospheric pressure, and which can uniformly produce a plasma by making the distribution of the gas contained in the discharge region uniform to thereby uniformly treat a large surface area and to achieve the enhancement of the treatment performance and the reduction in cost thereof. In addition, particularly, another object of the present invention is to realize a uniform distribution of the gas at all times without causing damages or the like to the porous element even in the case that an output of the power supply to be applied to the electrode is increased in a surface treatment apparatus in which the porous element is placed on a side on which an electric discharge is caused by the plate-like electrode, thereby increasing the speed of the surface treatment and enhancing the treatment performance.

Further, an object of the present invention is to provide a porous element electrode, which is used in the surface treatment apparatus, adapted so that the gas supplied to the discharge region passes through the electrode, and by which the distribution of the gas contained in the discharge region can be made uniform, and which has high durability and is in no danger of contaminating the workpiece by being subject to oxidation, corrosion and the like due to the gas species used in the apparatus, and which can reduce the operating cost thereof.

Moreover, another object of the present invention is to provide a surface treatment apparatus, which is called the line type, adapted so that it performs a surface treatment by using a plasma generated under a near atmospheric pressure when scanning the workpiece with the elongated electrode linearly extending when the workpiece performs a relative movement in a direction orthogonal to the longitudinal direction of the electrode, and which can regulate a discharge area along the longitudinal direction of the electrode and thereby can regulate the treatment rate of each part of the electrode according to the treatment conditions and which can enhance the treatment performance over the full-length of the electrode, thereby enabling the high-speed treatment of a large surface area.

Furthermore, the present invention aims at realizing the uniform distribution of the supplied gas over the full-length of the electrode in the surface treatment apparatus of the line type, thereby making the plasma uniform, enhancing the treatment performance and achieving the treatment of a large surface area.

Still another object of the present invention is to provide an efficient compact exhausting mechanism of a surface treatment apparatus of the line type, which can suppress the dispersion of a gas into the air, by limiting the exhaust path of the gas that has been supplied to the discharge region and which can prevent the air from being mixed in the discharge region and can stabilize the plasma discharge and the surface treatment utilizing the plasma discharge, and which can improve the treatment performance and reduce the treatment cost.

Additionally, yet another object of the present invention is to provide a surface treatment apparatus which uses a plasma under a near atmospheric pressure and which can eliminate the fear of occurrence of abnormal discharges such as an arc discharge among the electrode, the workpiece and the stage according to the discharge conditions regardless of the aforementioned electrode configuration and thereby can obtain a high output thereof and enhance the treatment performance thereof.

[DISCLOSURE OF THE INVENTION]

In accordance with an aspect of the present invention, there is provided a surface treatment apparatus for treating the surface of a workpiece by causing an electric discharge in a discharge region under atmospheric pressure or under a pressure close to atmospheric pressure, through use of a predetermined gas and by exposing active species, which are excited by the electric discharge, to the workpiece, comprising:

an electrode having holes through which the predetermined gas passes, for causing the electric discharge;

a porous dielectric placed in such a manner as to be adjacent to an electrode face of the electrode, which faces the discharge region; and a supporting member having a supporting face, by which an outer periphery portion of the porous dielectric is supported, and permits the dielectric to have thermal expansion deformation, which is associated with the temperature rise due to the electric discharge, on the supporting face.

In accordance with this aspect of the present invention, even when the porous dielectric expands thermally owing to the rising temperature as a result of the electric discharge, the thermal expansion deformation of the porous dielectric is allowed on the supporting face of the supporting member which supports the outer periphery of this porous dielectric. Thus, breakage and warpage of the body of the porous dielectric due to thermal stress can be effectively prevented. Therefore, the function of protecting the electrode by the porous dielectric can be ensured. Moreover, the function of uniformly dispersing the gas can be secured.

Here, it is preferable that when the electrode and the porous dielectric are placed horizontally, the supporting face of the supporting member is an upward inclined-face and further, a downward inclined-face is formed on the outer periphery portion of the porous dielectric in such a way as to slidably come into contact with the supporting face.

Thereby, when the thermal expansion deformation of the porous dielectric occurs, the expansion deformation of the outer periphery portion of the porous dielectric is permitted along the upward inclined-face of the supporting member.

In this case, the supporting member is adapted to be vertically movable with the progress of the thermal expansion deformation of the porous dielectric.

Thus, during the thermal expansion deformation of the outer periphery of the porous dielectric, the upward inclined-face of the supporting member is pressed down vertically the downward inclined-face formed on the outer periphery portion of the porous dielectric. Thereby, the horizontal position of the porous dielectric is not changed. Moreover the gap between the porous dielectric and the workpiece can be maintained at a certain distance.

In the case that the electrode and the porous dielectric are placed horizontally, the supporting face of the supporting member may be a horizontal face that is slidably in contact with the lower surface of the outer periphery portion of the porous dielectric.

Similarly, in this case, the thermal expansion deformation of the porous dielectric is permitted on the horizontal supporting face. Moreover, the horizontal position of the porous dielectric does not change.

In accordance with a surface treatment apparatus for treating a surface of a workpiece by causing an electric discharge in a discharge region under atmospheric pressure or under a pressure close to atmospheric pressure through use of a predetermined gas and by exposing active species, which are excited by the electric discharge, to the workpiece, comprising:

an electrode for causing the electric discharge;

a dielectric which is adapted to cover the electrode and is placed in such a manner as to face the discharge region; and a supporting member for supporting the dielectric, wherein the supporting member supports the dielectric in such a way as to have a degree of freedom in a direction in which the dielectric experiences a thermal expansion deformation associated with a temperature rise due to the electric discharge.

In the case of this apparatus of the present invention, similarly, the thermal expansion deformation of the dielectric, which results from the temperature rise due to the electric discharge, is allowed. Thus, the breakage thereof can be prevented. Thereby, the function of protecting the electrode can be maintained.

In accordance with a further aspect of the present invention, there is provided a surface treatment apparatus for treating a surface of a workpiece by causing an electric discharge in a discharge region under atmospheric pressure or under a pressure being lose to atmospheric pressure through use of a predetermined gas and by exposing active species, which are excited by the electric discharge, to the workpiece, comprising:

an electrode having holes through which the predetermined gas passes, for causing the electric discharge;

a porous dielectric placed in such a manner as to be adjacent to an electrode face of the electrode, which faces the discharge region; and a plurality of gas exhaust ports, which are able to regulate a flow rate independently of one another and are provided around the discharge region between the porous dielectric and the workpiece.

In the case of this apparatus of the present invention, even if the gap between the porous dielectric and the workpiece is not uniform, the flow of the gas to be exhausted therefrom to the surroundings can be made to be uniform. Thereby, the distribution of the gas in the discharge region can be made to be more uniform. Consequently, the discharging state and the degree of treatment can be made uniform over the entire discharge region.

Here, it is preferable that the plurality of gas exhaust ports are placed at even intervals along the periphery of the discharge region in the circumferential direction thereof.

Thereby, a uniform gas flow can be facilitated.

Moreover, it is preferable that each of the gas exhaust ports is opened at a height which is different than a height at which the discharge region is formed.

The direction of the flow of the exhausted gas is changed on the way to the exhaust ports by setting the discharge region at a height which is different than the height of each of the exhaust ports. This facilitates the equalization of the exhausting speed over the full-periphery of the discharge region. Thereby, the distribution of the gas concentration in the discharge region can be made to be more uniform.

Furthermore, an exhaust passage, which is narrower than the gap between the porous dielectric and the workpiece, may be provided at an upstream side of each of the gas exhaust ports.

Thus, the gas flow can be made to be more uniform over the full-periphery of the discharge region by utilizing the conductance of the narrow exhaust passages.

In accordance with still another aspect of the present invention, there is provided a surface treatment apparatus for treating a surface of a workpiece by causing an electric discharge in a discharge region under atmospheric pressure or under a pressure close to atmospheric pressure, through use of a predetermined gas and by exposing active species, which are excited by the electric discharge, to the workpiece, comprising:

an electrode, which has gas exhaust holes, for causing the electric discharge;

a porous dielectric placed in such a manner as to be adjacent to a first electrode face of the electrode, which faces the discharge region; and a plurality of gas inlets each for introducing the predetermined gas from the surroundings of the discharge region to the discharge region between the porous dielectric and the workpiece from the surroundings thereof, wherein the gas exposed to the workpiece is exhausted by being caused to pass through the porous dielectric and the electrode.

In the case of this apparatus of the present invention, the distribution of the gas in the discharge region can be made uniform by supplying the gas to a space between the porous dielectric and the workpiece from a plurality of directions therearound. Further, the gas can be ejected without exerting an influence on the distribution of the gas, by exhausting the gas through the porous dielectric and the electrode. Moreover, after the gas to be exhausted passes through the electrode, the gas can be exhausted at a single place in a centralized manner.

The plurality of gas inlets have flow rate regulation means which can regulate the flow rate of the gas independent of one another. Thereby, the distribution of the gas supplied to the discharge region can be made uniform. Further, it is preferable that the plurality of gas inlets are placed at even intervals along the periphery of the discharge region in the circumferential direction thereof. Thus, the distribution of the gas in the discharge region can be easily controlled by suitably regulating the flow rate of the gas supplied from each of the gas inlets.

Here, note that an exhaust catalyst can be placed in such a way as to be adjacent to a second electrode face which is opposite to the first electrode face of the electrode.

Thereby, the exhaust processes such as a process of removing ozone generated by the electric discharge, can be performed at a single place in a centralized manner simultaneously with the exhausting of the gas. Consequently, the contamination of the apparatus and the air can be effectively prevented.

In accordance with yet another aspect of the present invention, there is provided a surface treatment apparatus for treating a surface of a workpiece by causing an electric discharge in a discharge region under atmospheric pressure or under a pressure close to atmospheric pressure through use of a predetermined gas and by exposing active species, which are excited by the electric discharge, to the workpiece, comprising:

an electrode for causing the electric discharge; and a porous dielectric placed in such a manner as to be adjacent to a first electrode face of the electrode, which faces the discharge region, wherein the electrode is made of a porous aluminum material, through which the predetermined gas is able to pass.

In the case of this apparatus of the present invention, the uniforming of the distribution of the gas introduced into the discharge region can be further easily achieved. Moreover, because the reaction between aluminum and a fluorine-containing gas is weak, there are no concerns that the electrode reacts with the predetermined gas and causes corrosion or the like even if the predetermined gas to be introduced is a highly reactive gas among fluorine-containing gases and that a detached part thereof contaminates the workpiece and the apparatus and so on.

In this case, it is preferable that the porous dielectric is made of a porous aluminum material.

Thus, even when gases such as $O_2$ and $CF_4$ are introduced, such gases can be prevented from reacting with the electrode and the porous dielectric to cause oxidation, corrosion and so forth. Consequently, the probability of contamination of the workpiece, the apparatus and so on can be reduced.

In accordance with an additional aspect of the present invention, there is provided a surface treatment apparatus which comprises:

a first electrode on which a workpiece is placed;

a second electrode placed in such a manner as to face the first electrode; and an auxiliary electrode placed in such a way as to project from the workpiece to the second electrode around the workpiece, placed on the first electrode, wherein an electric discharge is caused between the first electrode and the second electrode and between the second electrode and the auxiliary electrode under atmospheric pressure or under a pressure which is close to atmospheric pressure, wherein active species excited by the electric discharge caused between the first electrode and the second electrode are exposed to treat a surface of the workpiece.

In the case of this apparatus of the present invention, even when the power output to be applied to the electrode is increased to a high level, an abnormal discharge first occurs between this electrode and the auxiliary electrode. Thus, the breakage of and the damage to the workpiece, the first electrode and so on, due to the abnormal discharge, can be prevented.

In this case, it is preferable that the height of a projected part of the auxiliary electrode can be regulated.

There by, the generation limit of an abnormal discharge can be regulated according to the treatment conditions such as the state of the surface of the workpiece.

In accordance with yet another aspect of the present invention, there is provided a surface treatment apparatus for treating a surface of a workpiece by exposing active species excited in a discharge region during moving the workpiece with respect to a discharge region produced under atmospheric pressure or under a pressure close to atmospheric pressure, which comprises:

a first electrode adapted to move the workpiece placed thereon;

a second electrode, which is formed in such a manner as to have a first width along a direction of the movement of the first electrode and to extend by setting a direction orthogonal to the direction of the movement of the first electrode as a longitudinal direction thereof, for producing the discharge region; and auxiliary electrode portions being detachably attached to the second electrode and having a second width along the direction of movement of the first electrode, wherein a range of the discharge region can be regulated by attaching and detaching the second electrode.

In the case of this apparatus of the present invention, the width of the electrode can be regulated by selectively attaching the auxiliary electrode portion. The range of the discharge region, namely, the area of the surface to be treated, can be regulated in response to the alteration of the workpiece and the treatment conditions.

In this case, the auxiliary electrode can be partly attached to the second electrode in the longitudinal direction.

Thus, an optimal treatment rate can be set correspondingly to each of the regions placed along the longitudinal direction of the electrode.

Significantly, the treatment rate at both longitudinal end portions of the second electrode, at which the treatment rates are usually low, can be increased by attaching the auxiliary electrode portions to both of the longitudinal end portions of the second electrode.

Alternatively, the auxiliary electrode portions can be attached to the second electrode in the longitudinal direction over the full-length of the second electrode.

Thereby, the treatment area of the entire electrode can be enlarged.

In accordance with still another aspect of the present invention, there is provided a surface treatment apparatus for treating a surface of a workpiece by exposing active species excited in a discharge region while moving the workpiece with respect to a discharge region produced under atmospheric pressure or under a pressure close to atmospheric pressure, which comprising:

a first electrode adapted to move when a workpiece is placed thereon; and a second electrode, which is formed in such a manner as to have a first width along the direction of movement of the first electrode and to extend by setting a direction orthogonal to the direction of the movement of the first electrode as a longitudinal direction thereof, for producing the discharge region, wherein the second electrode has:

an intermediate chamber which is formed along the longitudinal direction and to which gas to be supplied to the discharge region is introduced;

at least a gas inlet through which the gas is introduced into the intermediate chamber; and a gas ejecting port formed like a slit extending along the longitudinal direction, for ejecting the gas contained in the intermediate chamber to the discharge region, wherein at least the single gas inlet is opened at a position deviated from the prolonged line of the gas ejecting port.

In the case of this apparatus of the present invention, the amount of the portion of gas introduced from at least one gas inlet to the intermediate chamber, which directly flows to the gas ejecting port, becomes small. Namely, the gas flows toward the gas ejecting port after the gas pressure becomes uniform along the longitudinal direction of the electrode by changing the direction of gas flow once in the intermediate chamber, so that the distribution of gas in the discharge region can be made uniform.

Here, the intermediate chamber has two opposite side walls and a bottom wall in which the gas ejecting port is opened. Further, at least a gas inlet can be opened in one of the side walls.

Thus, the direction of the flow of the gas introduced from the gas inlet of one of the side walls is changed by the other side wall. Then, after being dispersed in the intermediate chamber, the gas is introduced to the gas ejecting port.

In this case, a dielectric for covering an electrode surface of the second electrode, which faces the discharge region, can be further provided in the apparatus, similarly. In such a case, the intermediate chamber is formed between the second electrode and the dielectric. Further, the gas ejecting port is formed in the dielectric.

Thereby, the frequency of occurrences of an abnormal discharge is reduced due to the presence of the dielectric. Consequently, the second electrode can be protected.

In accordance with yet another aspect of the present invention, there is provided a surface treatment apparatus for treating a surface of a workpiece by exposing active species excited in a discharge region during moving the workpiece with respect to a discharge region produced under atmospheric pressure or under a pressure being close to an atmospheric pressure, which comprises:

a first electrode adapted to move when a workpiece is placed thereon;

a second electrode, which is formed in such a manner as to have a first width along a direction of a movement of the first electrode and to extend by setting a direction orthogonal to the direction of the movement of the first electrode as a longitudinal direction thereof and has a gas ejecting port for ejecting gas along the longitudinal direction, for producing the discharge region; and a first extension member, which is provided at an upstream side of the second electrode in the direction of the movement, for forming a gap which is substantially equivalent to the gap between the second electrode and the workpiece.

In the case of this apparatus of the present invention, the gas flow in the direction opposite to the direction of the movement of the workpiece is restricted by the first extension member and thus the gas is not dispersed into the air, but flows along the surface of the workpiece. Consequently, if the flow rate of a discharge gas such as helium gas, which is contained in the aforementioned gas, is decreased to a level which is considerably lower than that of a conventional case, the electric discharge can be stabilized. Moreover, if organic substances or the like, removed from the workpiece, are redeposited at a position away from the discharge region, the electrode continues to perform a relative motion with respect to the workpiece. Thus, the redeposited substances can be treated again at a downstream side of the electrode by active species contained in the gas which flows along the surface of the workpiece.

Here, it is preferable that a second extension member for forming a gap, which is equivalent to a gap between the second electrode and the workpiece, is further provided at a downstream side of the second electrode in the direction of the movement.

Thereby, the dispersion of the gas can be more effectively restricted at both the upstream and downstream sides of the electrode.

In accordance with still another aspect of the present invention, there is provided a surface treatment apparatus for treating a surface of a workpiece by exposing active species excited in a discharge region during moving the workpiece with respect to a discharge region produced under atmospheric pressure or under pressure close to atmospheric pressure, which comprises:

a first electrode adapted to move horizontally when a workpiece is placed thereon;

a second electrode, which is formed in such a manner as to extend by setting a direction orthogonal to the direction of the movement of the first electrode as a longitudinal direction thereof and has a gas ejecting port for ejecting gas along the longitudinal direction, for producing the discharge region; and a pair of first partition walls, which are respectively placed at upstream and downstream sides of the second electrode in the direction of the movement and are disposed in such a manner as to vertically extend so that a gap is interposed between the second electrode and each of the partition walls of the first pair, wherein the gas exposed to the workpiece is exhausted through the gaps, each of which is disposed between the second electrode and a corresponding one of the first partition walls.

In the case of this apparatus of the present invention, the gas supplied from the gas ejecting port to the discharge region is exhausted by following the inside of each of the first partition walls, which are placed at both sides of the second electrode, without being dispersed directly and immediately into the air. Consequently, the amount of air mixed in the discharge region is reduced. Moreover, the electric discharge can be stably maintained.

Here, note that a pair of second partition walls may be provided so that each of the second partition walls is placed in parallel with and outside a corresponding one of the first partition walls. Further, a gas may be introduced into a gap between each pair of the first and second walls which correspond to and face each other. Thereby, gas curtains for separating the discharge region from the air can be formed at both sides of the discharge region, respectively. Thereby, the amount of air mixed into the discharge region can be further decreased.

In accordance with yet another aspect of the present invention, there is provided a surface treatment apparatus for treating a surface of a workpiece by exposing active species excited in a discharge region during moving the workpiece with respect to a discharge region produced under atmospheric pressure or under a pressure close to atmospheric pressure, which comprises:

a first electrode adapted to move horizontally when a workpiece is placed thereon;

a second electrode, which is placed at a position opposite to the movement path of the first electrode in such a manner as to extend vertically, for producing a discharge region between the first and second electrodes; and a first partition wall that is placed at an upstream side of the second electrode in the direction of the movement in such a manner as to extend vertically, and to form a space which is used for introducing the discharge region, between the second electrode and the first partition wall; and a second partition wall that is placed at a downstream side of the second electrode, in the direction of the movement, in such a manner as to extend vertically, and to form a space which is used for exhausting a gas from the discharge region, between the second electrode and the second partition wall.

In the case of this apparatus of the present invention, the gas is supplied to the discharge region from a downstream side of the second electrode in the direction of the movement of the workpiece and is exhausted at an upstream side of the second electrode. Thus, air can be prevented from being mixed in the discharge region. Moreover, the electric discharge can be stabilized. Furthermore, even if impurities are deposited onto the surface of the workpiece at an upstream side of the discharge region, the redeposited substances can be removed in the discharge region as a result of the movement of the workpiece. Additionally, the gas used in the discharge processing can be exhausted from a vicinity of the discharge region, so that the exhausted gas can be efficiently treated without being emitted into the air. Moreover, the exhaust configuration can be miniaturized.

[BEST MODE FOR CARRYING OUT THE INVENTION]

Hereinafter, the embodiments of the present invention will be described in detail by referring to the accompanying drawings.

(First Embodiment)

Figure 1:
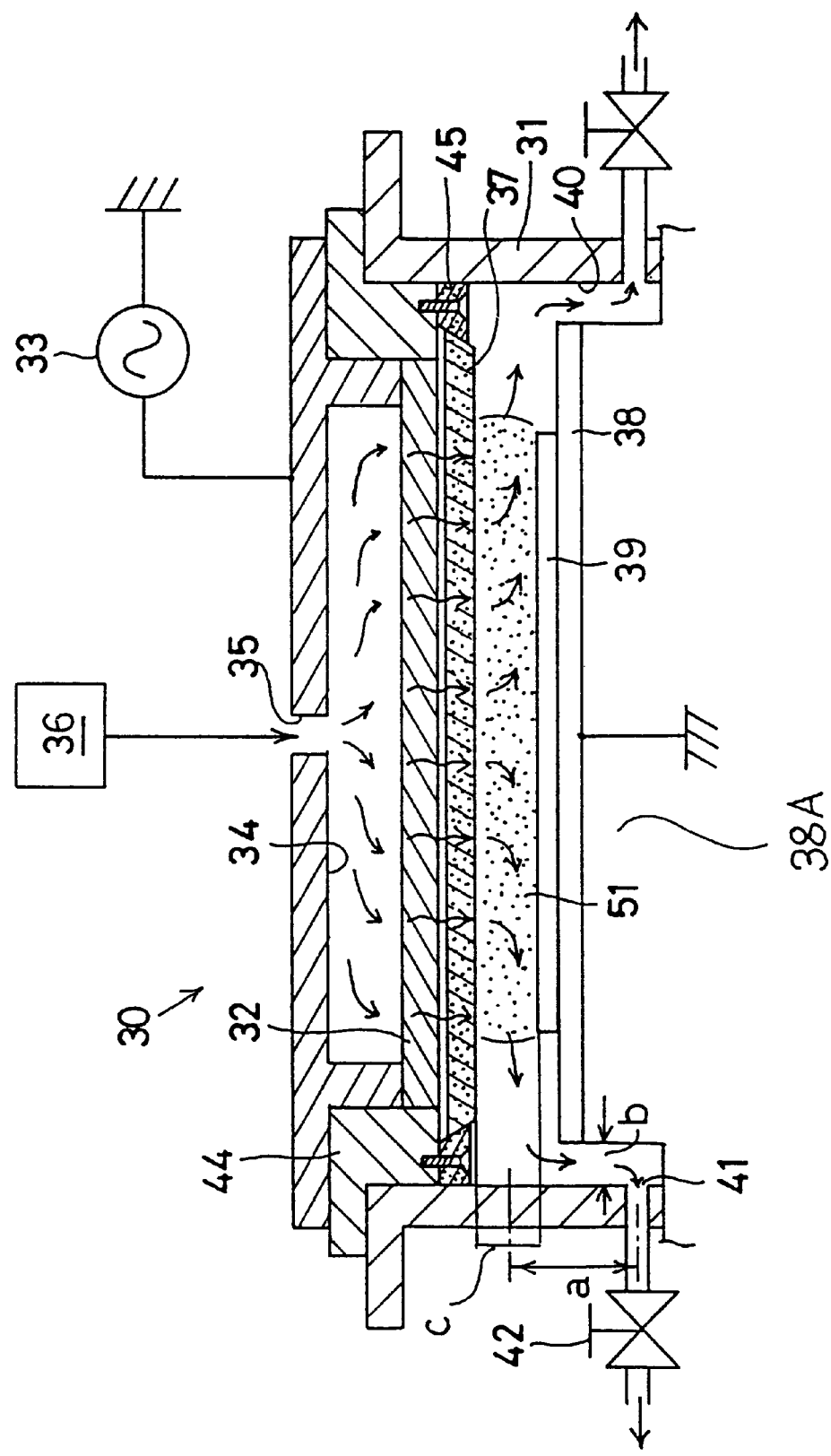
FIG. 1 is a sectional diagram for showing the configuration of a first embodiment of the present invention, namely, a surface treatment apparatus of what is called the opposed-face type, embodying the present invention.

FIG. 1 illustrates the configuration of a preferred embodiment of the present invention, namely, a surface treatment apparatus of the opposed-face type embodying the present invention. The surface treatment apparatus 30 has a disk-like electrode 32 placed horizontally in a round housing 31. The electrode 32 is constituted of a porous element made of, for example, an aluminum material and is connected to an alternating current power supply 33. A chamber 34 defined by the upper part of the electrode 32 is connected to an external gas supply 36 through a gas inlet 35. A disk-like dielectric 37 made of a porous material such as a ceramic material, for example, alumina ($Al_2O_3$) or the like is placed under the bottom surface of the electrode 32.

Under the dielectric 37, a workpiece, namely, a workpiece 39 such as a wafer, on which a surface treatment is performed, is placed in such a manner that a gap having a constant width of about 1 to 2 mm or so is formed between the circular stage 38 and the dielectric 37. A grounded electrode 38A is placed under a part of the stage 38, which corresponds to the work 39. Further, if necessary, a dielectric may be provided between the stage and the work. An exhaust passage 40 is provided by an opening b, which is narrower than a gap c, between the peripheral surface of the stage 38 and the inner peripheral surface of the housing 31. Moreover, many gas exhaust ports 41 are provided in the bottom end portion of the housing 31 at uniform intervals in the circumferential direction and at a position having a height which is offset downwardly from the height of the center between the dielectric 37 and the work 39 by an equivalent height a. A flow-rate control means 42 constituted by, for example, a needle valve, is provided at each of the gas exhaust ports 41.

Figure 2A:
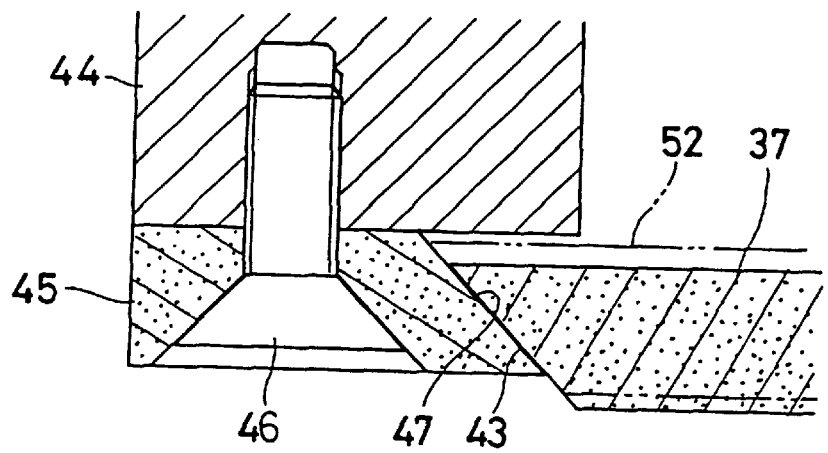
FIGS. 2A to 2C are partially enlarged diagrams for showing different mounting configurations of a porous dielectric, respectively.

FIG. 2A illustrates the mounting configuration of the dielectric 37. A downward inclined-face 43 is formed on the outer peripheral edge of the dielectric 37 over the full-circumference of the dielectric 37. A thin ring-like supporting member 45 constituted by a dielectric such as a ceramic is fixed to the bottom surface of a mounting portion 44, which is provided between the electrode 32 and the housing 31 and is similarly constituted by a dielectric such as a ceramic, with fittings such as countersunk head screws 46. A supporting face 47 constituted by an upward inclined-face is formed on the inner peripheral edge of the supporting member 45 over the full-circumference thereof. The supporting face 47 is formed in such a manner as to extend obliquely upwardly from the inclined-face 43 at an angle of inclination which is equal to that of inclination of the inclined-face 43 of the dielectric 37. As illustrated in this figure, the dielectric 37 is supported by making the inclined-face 43 come in slidable contact with the supporting face 47 of the supporting member 45 in such a manner as to be able to cause a relative displacement along the supporting face in radial directions. As a result of supporting the dielectric 37 in such a manner, there is provided the function of centering the dielectric 37.

Figure 2B:
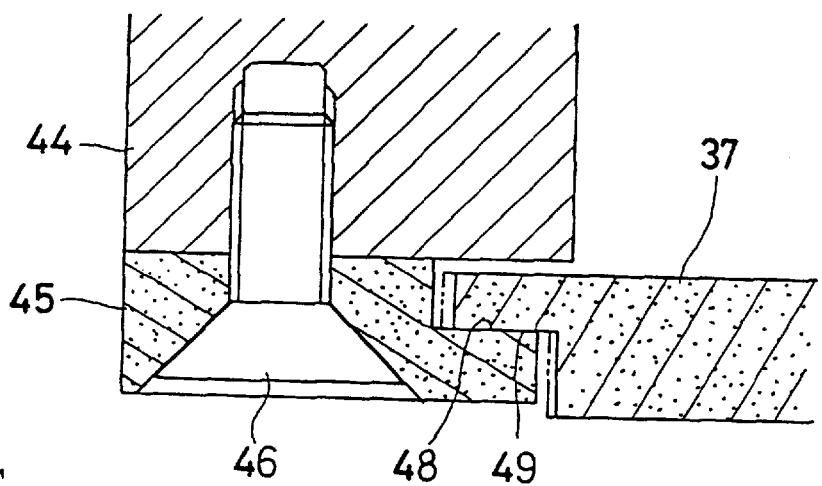
Figure 2C:
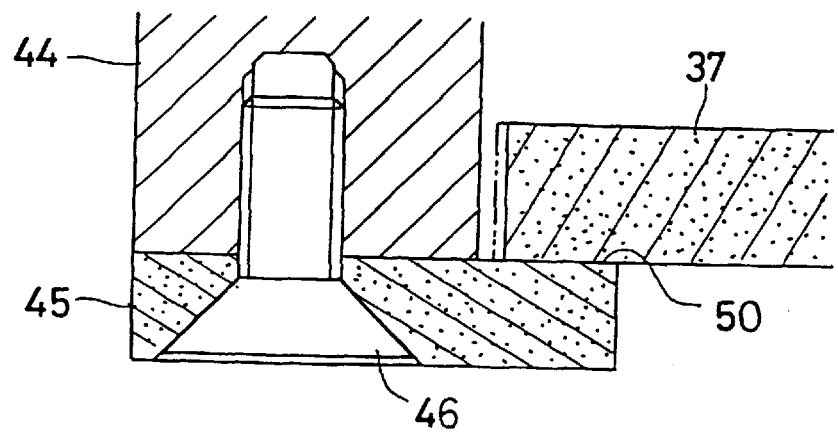

FIGS. 2B and 2C illustrate other examples of the mounting configuration of the dielectric 37. In the case of the mounting configuration of FIG. 2B, a downward step portion 48 is formed in the outer peripheral edge of the dielectric 37. On the other hand, an upward portion 49, whose inner diameter is larger than the diameter of the outer circumference of the dielectric 37, is provided in the inner peripheral edge of the supporting member 45 over the full-circumference thereof. A shoulder portion of the step portion 49 is used as a horizontal supporting face. Further, the step portion 48 of the dielectric 37 is supported by being placed on this shoulder portion. In the case of the example of FIG. 2C, a shoulder portion 50 is formed by making the inner peripheral end portion of the supporting member 45 project inwardly from the mounting portion 44 and is used as a horizontal supporting face. The outer peripheral edge of the dielectric 37 is supported thereon in such a way that a certain opening is formed between the inner peripheral surface of the mounting portion 44 and the outer peripheral edge of the dielectric 37. Thus, in the case of each of the examples of FIGS. 2B and 2C, the outer peripheral edge of the dielectric 37 is supported in such a manner as to cause a relative displacement in the radial directions along the supporting face of the supporting member 45, similarly as in the case of the mounting configuration of FIG. 2A.

To perform a surface treatment on the work 39, a predetermined discharge gas is supplied from the gas supply 36 through the gas inlet 35, so that the gas contained in the chamber 34 is replaced with the discharge gas. The aforementioned discharge gas is suitably selected in accordance with the surface treatment to be performed. Moreover, it is convenient that helium is mixed into the discharge gas so as to facilitate and stabilize the initiation of the electric discharge. The discharge gas is continuously supplied into the chamber 34 and passes through the electrode 32 and the dielectric 37 which are porous elements. Thereby, the discharge gas is nearly uniform in the discharge region 51. Simultaneously, when a predetermined voltage is applied from the power supply 33 to the electrode 32, an electric discharge is caused between the electrode 32 and the grounded electrode 38A. In the discharge region 51 between the dielectric 37 and the work 39, active species such as the excited species of the gas and ions are generated owing to the dissociation, the electolytic dissociation and the excitation of the discharge gas, which are caused by a plasma. A desired treatment corresponding to the kind of discharge gas is performed on the work 39 by exposing these excited active species to the work 39. As above-mentioned, the electrode 32 is constituted by an aluminum porous element. Moreover, as is well known, the reaction between an aluminum material and fluorine is weak. Thus, the aluminum material is advantageous, because even in the case that gasses such as $O_2$ and $CF_4$ are used as the discharge gas, there are no concerns that a part of the electrode is detached owing to oxidation and corrosion and so forth and that the detached part contaminates the surface of the work and the interior of the apparatus. Similarly, the dielectric 37 is made of alumina ($Al_2O_3$), so that the dielectric 37 are not subject to oxidation and corrosion.

The aforesaid discharge gas supplied into the discharge region 51 flows outwardly radially therearound. Then, the direction of gas flow is changed into a downward direction along the inner peripheral surface of the housing 31. Subsequently, the gas passes through the exhaust passage 40 and is exhausted from each of the gas exhaust ports 41 to the exterior. Each of the gas exhaust ports 41 is opened at a position which is lower than the central position of the discharge region 51 by the distance a, as illustrated in the figure. Therefore, the flow of the exhaust gas can be prevented from being concentrated in a certain direction. Further, the width b of the exhaust passage 40 is set so that the following inequality is satisfied: c>b. Hence the gas can be exhausted from the surroundings of the discharge region 51 further uniformly by utilizing the conductance of the passage 40. Moreover, a certain gap cannot be fixed between the dielectric 37 and the work 39 owing to a mounting error or the like of the surface treatment apparatus 30. When the flow of the exhaust gas is deviated or deflected in a certain direction, the flow of the gas can be made uniform by controlling the flow rate at each of the gas exhaust ports 41 by means of the flow rate regulation means.

Furthermore, in the case of the first embodiment, the dielectric 37 is thermally expanded in radial directions owing to a temperature rising resulting from the electric discharge. The dielectric 37, however, is mounted by the separate supporting member 45 in such a manner as to be able to cause a relative displacement on the outer peripheral edge thereof, as described above. Thus, the dielectric 37 moves along the supporting face 47 radially outwardly to a position as indicated by, for example, a phantom line 52 in FIG. 2A. Hence, there are no concerns that a crack will be caused in the dielectric 37 due to thermal stress, as in the conventional apparatus in which the dielectric is restrained by the fittings. Therefore, the output of the electrode 32 can be increased to a considerably high level. Consequently, a plasma can be generated in high density. Moreover, the treatment rate can be increased.

Figure 14:
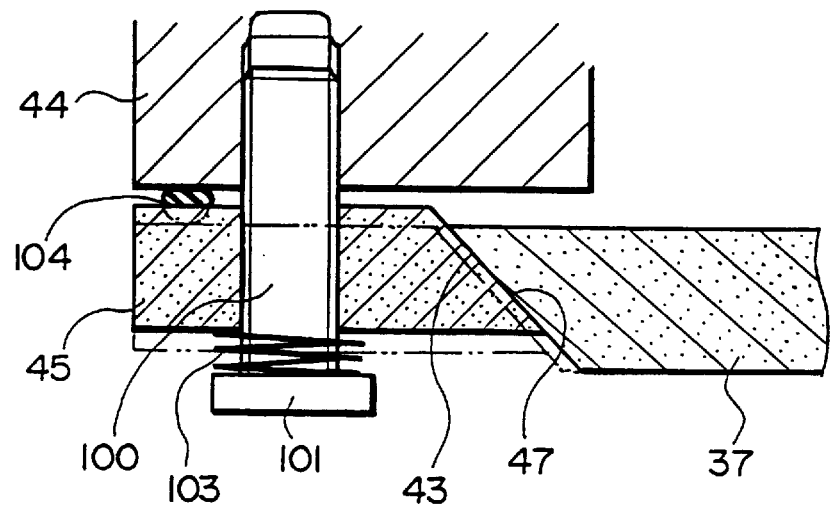
FIG. 14 is a schematically sectional diagram for illustrating the supporting configuration of a dielectric which is different from those of FIGS. 2A to 2C.

Incidentally, the supporting member 45 is not necessarily limited to that of the type fixed to the mounting portion 44. For example, as illustrated in FIG. 14, the supporting member 45 is provided in such a way as to be able to move vertically along a shank 100 having a flange 101. At that time, it is preferable that a spring 103 is provided between the bottom surface of the supporting member 45 and the flange 101 and that an airtight sealant 104 such as an 0-ring is placed between the top surface of the supporting member 45 and the bottom surface of the mounting portion 44.

If the dielectric 37 is thermally expanded and deformed, as indicated by chain lines in the configuration of FIG. 14, the inclined-face 43 of the dielectric 37 pushes down the inclined-face 47 of the supporting member 45. Thus, the supporting member 45 moves downwardly vertically as indicated by chain lines in this figure against a pushing force of the spring. Thereby, the thermal expansion deformation of the dielectric 37 is allowed.

In the case of the example of FIG. 14, even when the dielectric 37 is thermally expanded, the height of the horizontal position of the dielectric 37 does not change, which is different than in the case of FIG. 2A. This is the same with the case of the examples of FIGS. 2B and 2C. Therefore, the examples of FIGS. 2B, 2C and 14 are superior in the respect that the gap between the dielectric 37 and the workpiece 39 can be maintained at a constant value. Moreover, the example of FIG. 14 has a further advantage in that the centering of the dielectric 37 can be achieved.

(Second Embodiment)

Figure 3:
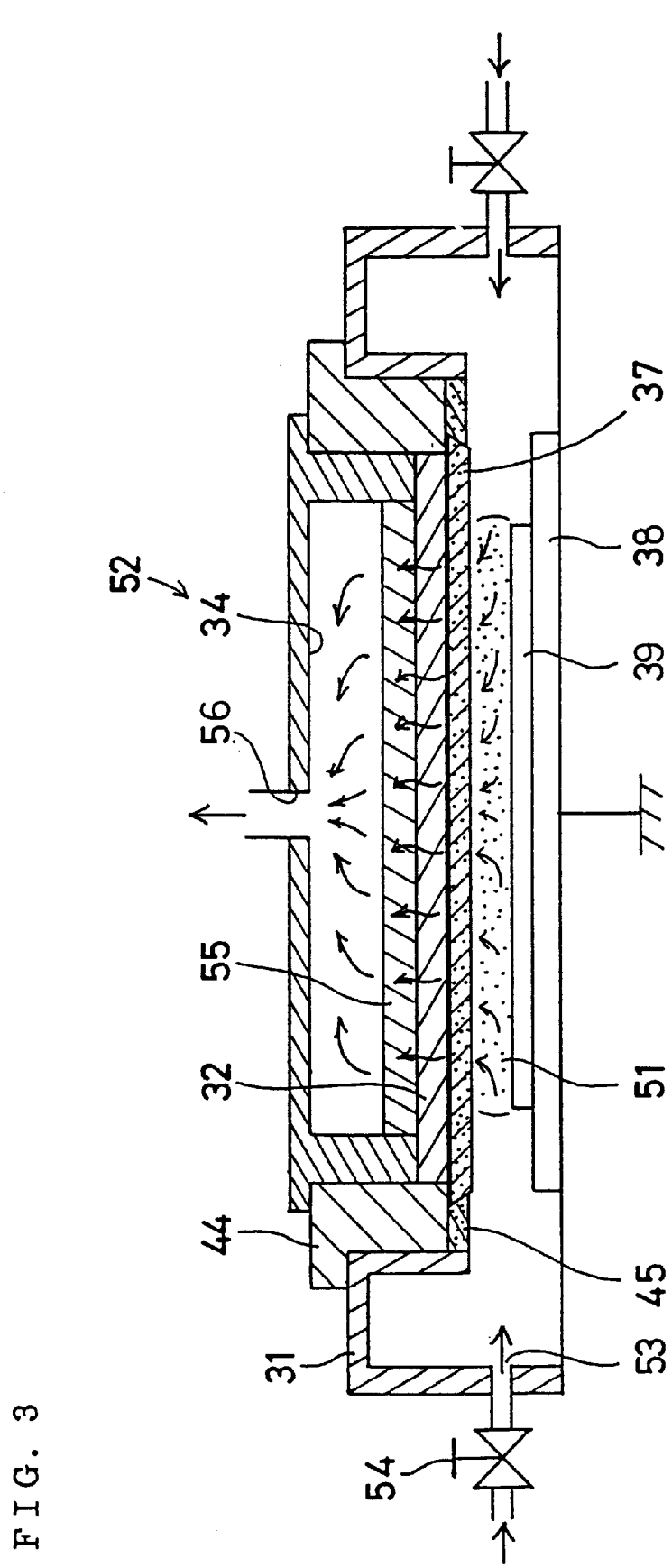
FIG. 3 is a sectional diagram for schematically showing the configuration of a second embodiment of the present invention, namely, another surface treatment apparatus embodying the present invention.

FIG. 3 illustrates the configuration of a second embodiment of the present invention, namely, another surface treatment apparatus of the face type embodying the present invention. Although a surface treatment apparatus 52 of this embodiment has a configuration which is nearly similar to that of the surface treatment apparatus 30 of FIG. 1, many gas inlets 53 are opened in the housing 31 at uniform intervals in the circumferential direction in such a way that the discharge gas is uniformly supplied into a discharge region 51, which is a gap, whose width is 1 to 2 mm, formed between the dielectric 37 and the work 39 from the surroundings thereof in various directions. Flow rate regulation means 54 are provided at the gas inlets 53, respectively. Thereby, even in the case where a gap is not uniformly formed between the dielectric 37 and the work 39 owing to a mounting error or the like of the surface treatment apparatus 52, the gas can be fed to the discharge region 51 by regulating the distribution of the gas in such a way as to be uniform. Moreover, an ozone absorbing catalyst 55 is placed on the electrode 32. The gas contained in the housing 31 is replaced with the discharge gas by supplying the discharge gas from each of the gas inlets 53. Simultaneously, an electric discharge is caused between the electrode 32 and the grounded electrode 38 by applying a predetermined voltage to the electrode 32. The discharge gas is continuously supplied into the discharge region 51 and then flows into the chamber 34 after it passes through the electrode 32 and the catalyst 55. Subsequently, the gas is exhausted to the exterior through a gas exhaust port 56. The surface of the work 39 is treated by the excited active species of the gas generated in the discharge region 51. Ozone, which is generated during this electric discharge, and organic substances or the like, which are removed from the surface of the work 39 by ashing or the like, are eliminated by the catalyst 55 when exhausted from the side of the electrode 32. This embodiment is advantageous because there are no concerns that ozone contaminates the air and that the organic substances are redeposited onto the work 39 and the interior of the apparatus. Thus, in the case of the second embodiment, the exhaust processing can be performed simultaneously with the exhausting of the gas. Consequently, there is no necessity of providing a separate exhaust processing device in the apparatus. Further, the configuration of the entire apparatus can be simplified. Moreover, the size and cost of the apparatus can be reduced.

(Third Embodiment)

Figure 4:
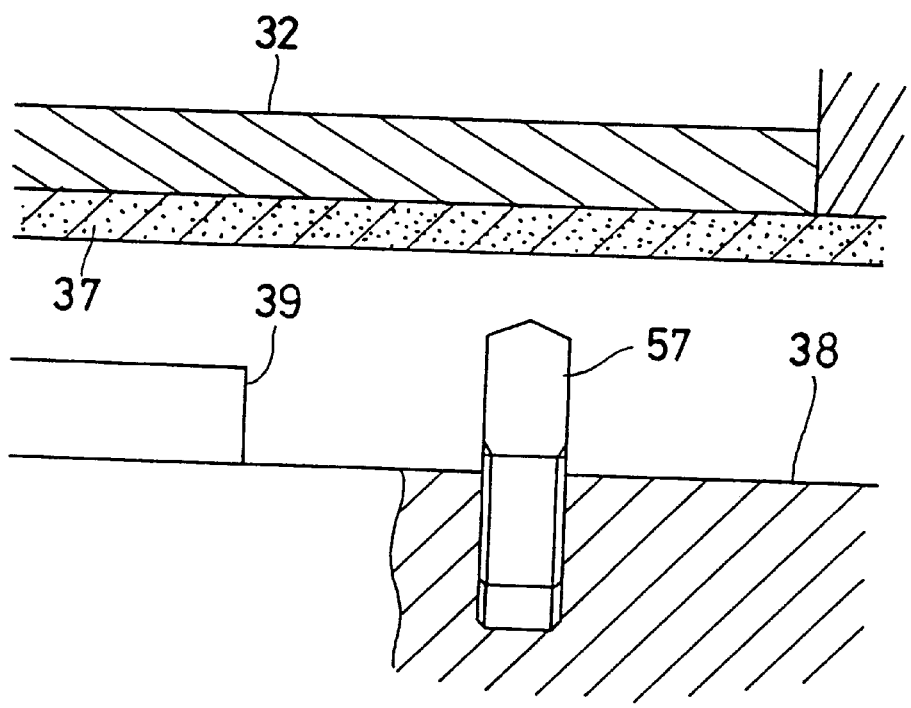
FIG. 4 is a diagram for partially illustrating the configuration of a third embodiment of the present invention, namely, still another surface treatment apparatus embodying the present invention.

FIG. 4 illustrates the configuration of a third embodiment of the present invention, namely, a surface treatment apparatus of the opposed-face type embodying the present invention. In the case of this embodiment, an auxiliary grounded electrode 57 for abnormal discharge processing is provided on the top surface of a stage (the first electrode) 38 in such a way as to protrude from the stage 38 at a position which is shifted outward from the work 39 and is under the electrode 32. The gap between the tip end of the auxiliary grounded electrode 57 and the electrode (the second electrode) 32 can be suitably adjusted by changing the length of the projected part thereof from the stage 38 by using screws or the like. Namely, the gap is adjusted to a suitable value in such a way that the impedance between the faces of the electrode 32 and the auxiliary grounded electrode 57, which are opposed to each other, becomes locally lower than the plasma impedance corresponding to the abnormal discharge limit of the work on which a surface treatment is to be performed. Thereby, even in the case of the work which is liable to cause an abnormal discharge by being provided with a projection and a metallic part on the surface thereof, an arc discharge is not caused toward the surface of the work but is caused toward the auxiliary grounded electrode 57. Thus, it is convenient that the auxiliary grounded electrode 57 is made of a high-melting-point metal in such a manner as to not melt easily on occurrences of an abnormal discharge. Therefore, in the case of the third embodiment, an occurrence of an abnormal discharge toward the surface of the work or toward the stage can be avoided. Consequently, the discharge output can be made to be higher than the abnormal discharge generation limit of the work. Further, the treatment rate can be increased. Moreover, the work and the stage can be effectively prevented from being broken or damaged as a result of an abnormal discharge.

(Fourth Embodiment)

Figure 5:
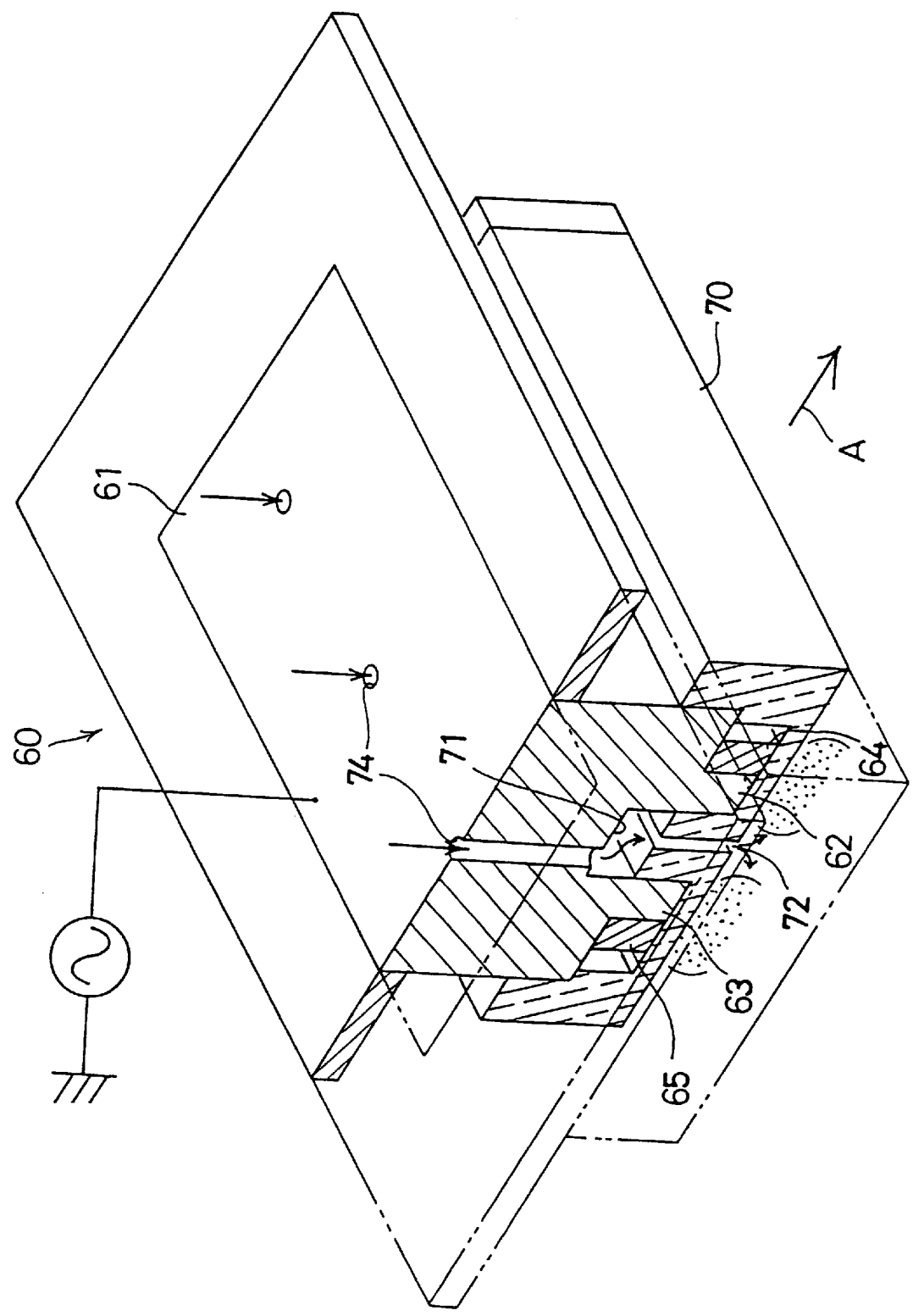
FIG. 5 is a partial sectional diagram for illustrating the configuration of a fourth embodiment of the present invention, namely, a surface treatment apparatus of the line type.
Figure 6A:
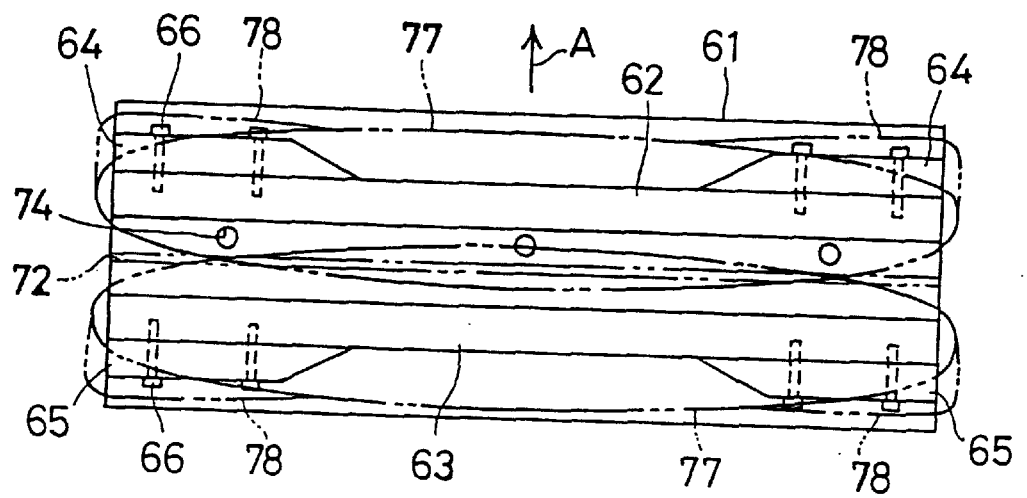
FIGS. 6A and 6B are bottom plan views showing the configurations of different examples of electrodes used in the surface treatment apparatus of FIG. 5, respectively.
Figure 6B:
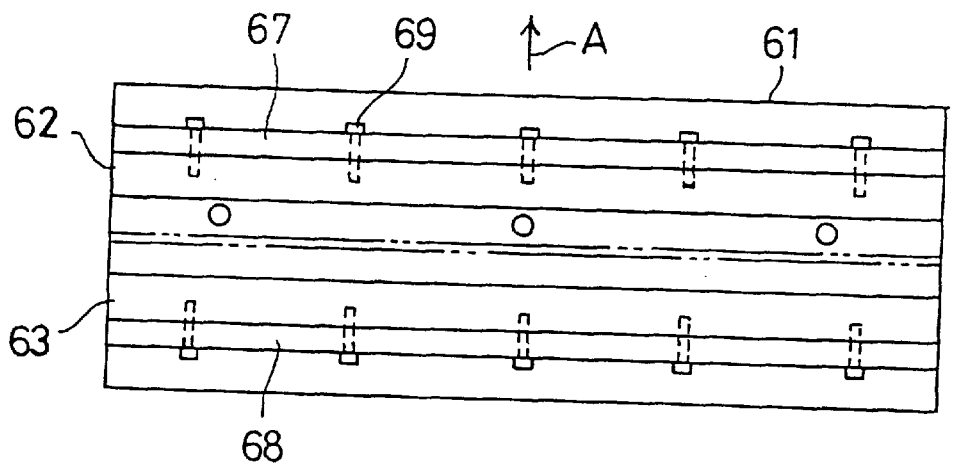

FIG. 5 illustrates the configuration of another embodiment of the present invention, namely, a surface treatment apparatus of the line type embodying the present invention. The surface treatment apparatus 60 has a nearly-rectangular-prism-like electrode 61, which is elongated in a direction orthogonal to the direction of the movement of the work as indicated by an arrow A. Incidentally, a first electrode for moving a work which is placed thereon is not shown in FIG. 5. Two discharge generating portions (second electrodes) 62 and 63 of the same size and shape are provided on the bottom surface of the electrode 61 at uniform intervals or distances along the longitudinal direction thereof over the full-length thereof in such a way as to downwardly protrude therefrom. As illustrated in FIG. 6A, pairs of auxiliary electrodes 64 and 65 are integrally fixed to the outer surfaces of both ends of the discharge generating portions 62 and 63, respectively, with bolts 66. The widths of discharge generating portions 62 and 63 of the electrode 61 are outwardly enlarged at both longitudinal ends thereof by using the auxiliary electrodes 64 and 65. Further, in the case of another example, auxiliary electrodes 67 and 68 are integrally mounted on the discharge generating portions 62 and 63 over the full-length thereof with bolts 69, respectively, as illustrated in FIG. 6B.

Figure 7A:
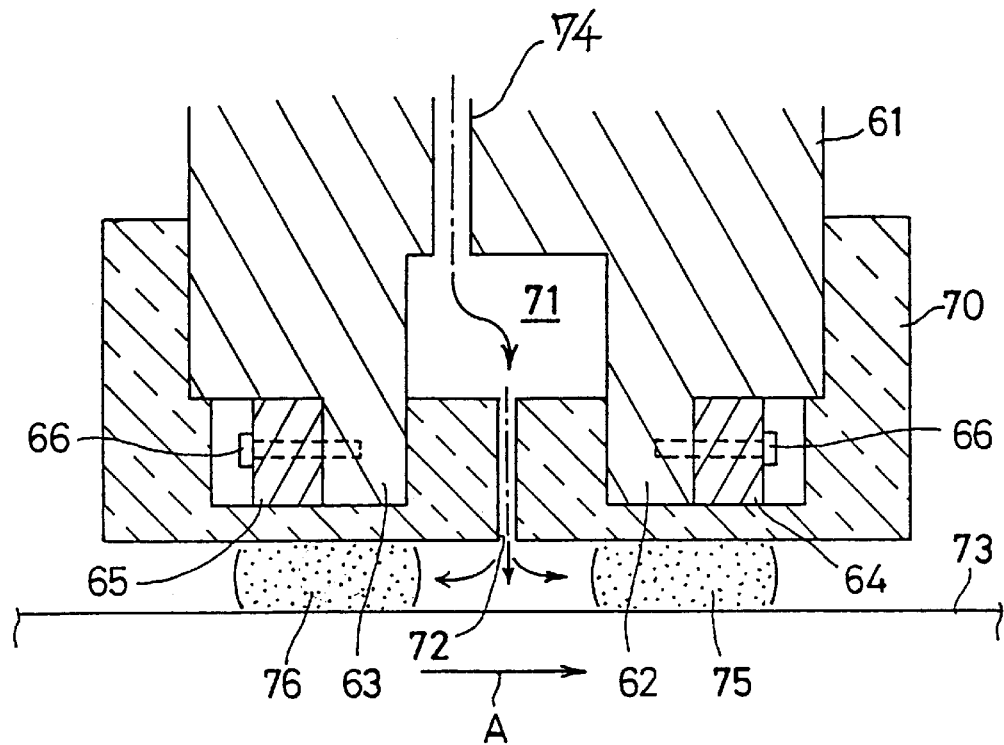
FIGS. 7A is an enlarged partial sectional view of the surface treatment apparatus of FIG. 5.
Figure 7B:
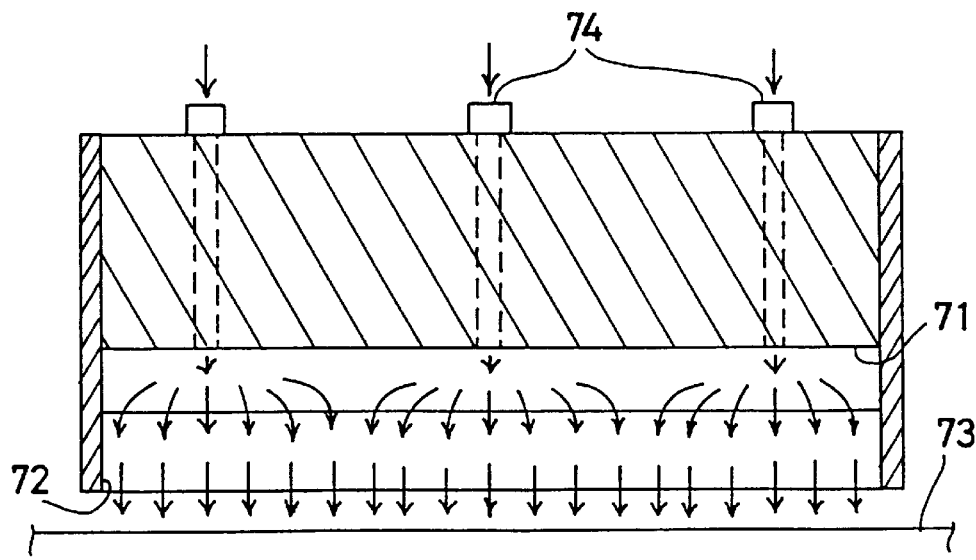
FIG. 7B is a longitudinal sectional view of the surface treatment apparatus of FIG. 5.

As illustrated in FIGS. 5 and 7A, a dielectric 70 is attached to the lower portion of the electrode 61 in such a manner as to completely enclose the discharge generating portions 62 and 63. An intermediate chamber 71 extending the longitudinal direction of the electrode 61 is defined between the discharge generating portions 62 and 63. In the central portion of the dielectric 70, a gas ejecting port 72 communicating with the intermediate chamber 71 is opened along the longitudinal direction of the electrode 61 linearly and downwardly toward the surface of the work 73. Three gas inlets 74 are opened in the top surface portion of the electrode 61 at uniform intervals and communicate with the intermediate chamber 71. As is well shown in FIG. 7A, the gas ejecting port 72 is connected to the central position of the intermediate chamber 71, whereas the gas inlets 74 are connected to end portions of the intermediate chamber 71. In other words, the three gas inlets 72 are placed in such a manner as to be offset from the prolonged line of the gas ejecting port 72. Thus, the discharge gas introduced from the three gas inlets 74 changes its direction of flow in the intermediate chamber 71 and flows into the gas ejecting port 72. Namely, as illustrated in FIG. 7B, the gas pressure is nearly uniform along the longitudinal direction in the intermediate chamber and is ejected nearly uniformly from the gas ejecting port 72 over the full-length thereof.

Figure 15:
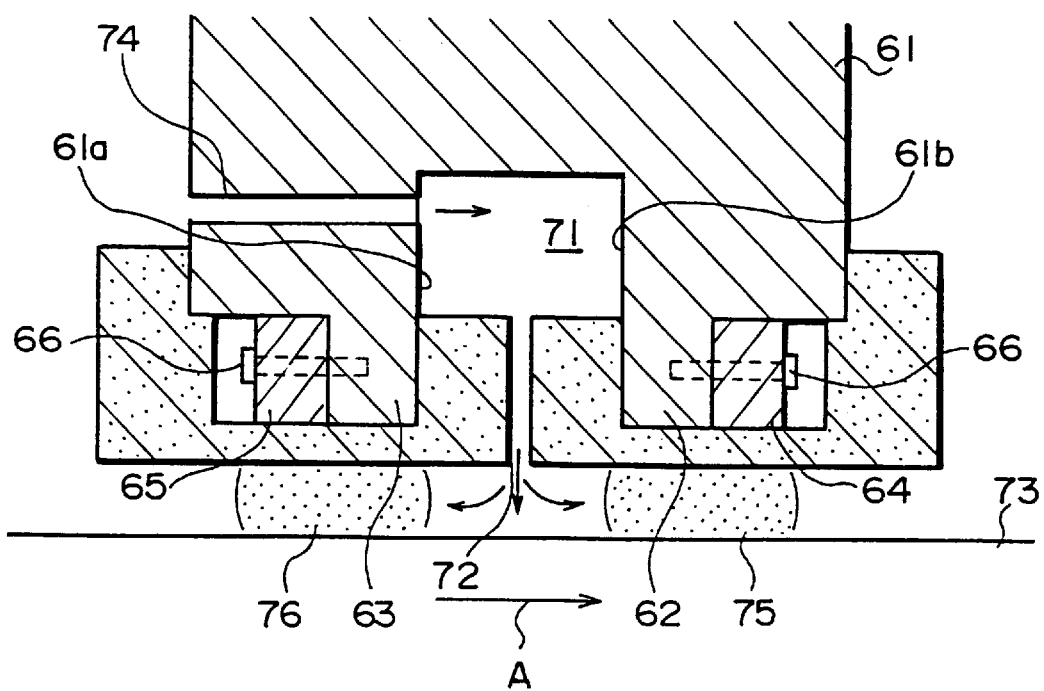
FIG. 15 is a schematic sectional diagram for illustrating a gas introducing configuration which is different from that of FIG. 7A.

Further, in the case of another example, as illustrated in FIG. 15, the gas inlets 74 are opened in one 61a of two side walls 61a and 61b, which face each other and compose the intermediate chamber 71. In this case, the direction of the flow of the discharge gas introduced from the gas inlets 74 is changed by the other side wall 61b, and then the discharge gas is dispersed in the intermediate chamber 71. After this dispersion, the discharge gas is ejected from the gas ejecting port 72. Thus, similarly as in the case of FIG. 7A, the discharge gas can be introduced thereto from lateral directions. Further, the gas can be ejected almost uniformly from the gas ejecting port 72 over the full-length thereof.

In the case of still another example, a porous element can be provided on the gas ejecting port 72 in the intermediate chamber 71. Thereby, the discharge gas can be further uniformly distributed over the full-length of the gas ejecting port 72.

Thus, when the predetermined voltage is applied to the electrode 61 by simultaneously ejecting the predetermined discharge gas from the gas ejecting port 72 to the surface of the work, an electric discharge is caused between each of the generating portions 62 and 63 and the work 73, which is placed on the first electrode 38, and moves, at both sides of the gas ejecting port 72. Excited active species due to a plasma are generated from the discharge gas, which is ejected from the gas ejecting port 72, in discharge regions 75 and 76. Thereby, the surface of the work 73 is treated.

In the case of this fourth embodiment, as illustrated in FIG. 6A, conventional ellipse-like discharge regions indicated by reference numeral 77 are enlarged to regions indicated by reference numeral 78 at both longitudinal ends thereof, by enlarging the width of each of the discharge generating portions 62 and 63 by attaching the pair of the auxiliary electrodes 64 and 65 to both ends of the portions 62 and 63, respectively. Thus, the treatment performance at both longitudinal end portions of the electrode 61 is enhanced to a level which is almost equal to that of the treatment performance thereof. Thereby, a work of a larger size can be treated. Furthermore, in the case that the width of each of the discharge generating portions 62 and 63 is enlarged over the full-length thereof as illustrated in FIG. 6B, the entire discharge regions are expanded.

(Fifth Embodiment)

Figure 8:
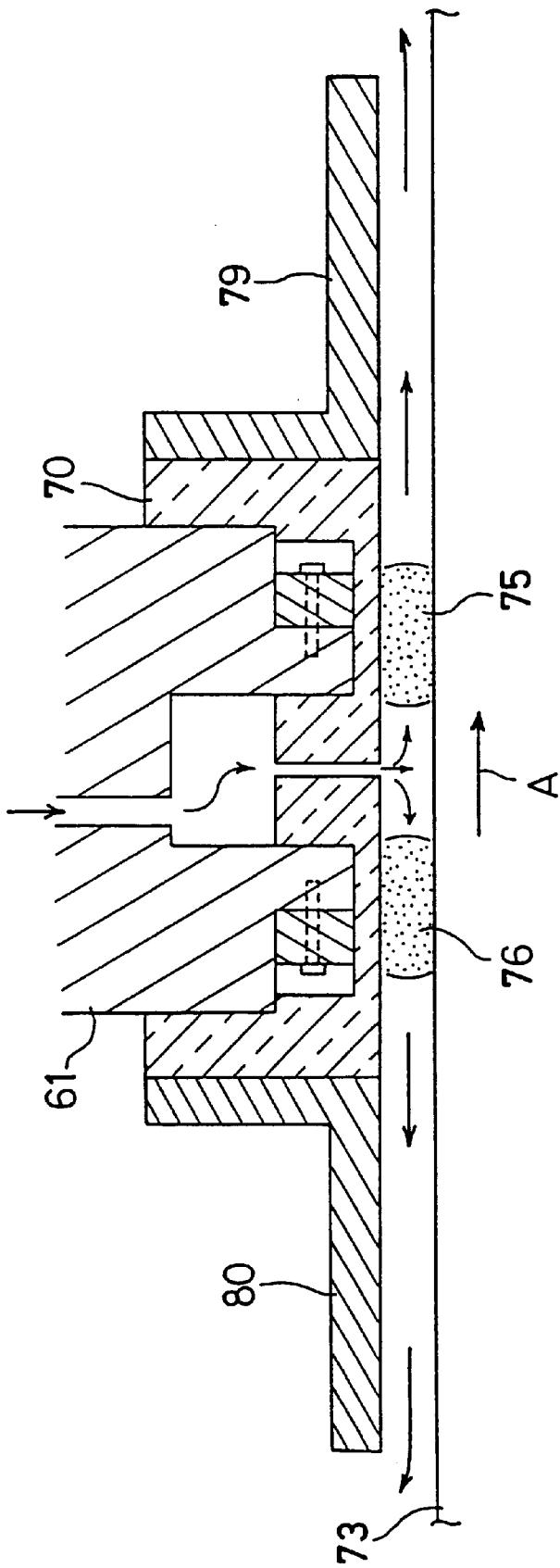
FIG. 8 is a sectional diagram for illustrating the exhaust configuration of a fifth embodiment of the present invention, namely, still another surface treatment apparatus embodying the present invention.

FIG. 8 illustrates the configuration of an example of a modification of the surface treatment apparatus of the line type of FIG. 5. In the case of the fifth embodiment, a first extension member 80 and a second extension member 79 are integrally attached to the electrode 61, along the direction of the movement of the work 73 placed on the first electrode (not shown), at an upstream side of the electrode (the second electrode) 61 and at a downstream side thereof, respectively, in the direction of the movement. Narrow exhaust passages, whose widths are nearly equal to that of the gap between the dielectric 70 and the surface of the work 73, are formed at upstream and downstream sides of the electrode 61 in such a way as to extend from the discharge regions 75 and 76, respectively. Therefore, the discharge gas is exhausted into the air after passing through the exhaust passages from the discharge regions 75 and 76.

Thus, even if the flow rate of helium contained in the discharge gas is reduced to 5 liters per minute or so from 20 liters per minute or so in the case of the conventional case, a stable electric discharge can be obtained by confining the discharge gas between the electrode and the work for a longer term without immediately dispersing the discharge gas into the air. Further, the extension members prevent air from being drawn into the discharge regions 75 and 76. Therefore, organic substances or the like which had been removed from the work can be prevented from being redeposited thereon. Especially, at an upstream side of the electrode 61, the discharge gas flows backwards into the direction of the movement of the work. Thus, a turbulent flow is liable to occur, and the air is apt to be drawn into the discharge region thereat. However, the air can be prevented from being drawn into the discharge region thereat.

Incidentally, in the case of another example, similar effects can be obtained by similarly shaping the passage which is used for guiding the work to be treated into a space under the electrode 61, like a narrow tunnel, instead of providing extension members at the upstream and downstream sides of the electrode 61.

(Sixth Embodiment)

Figure 9:
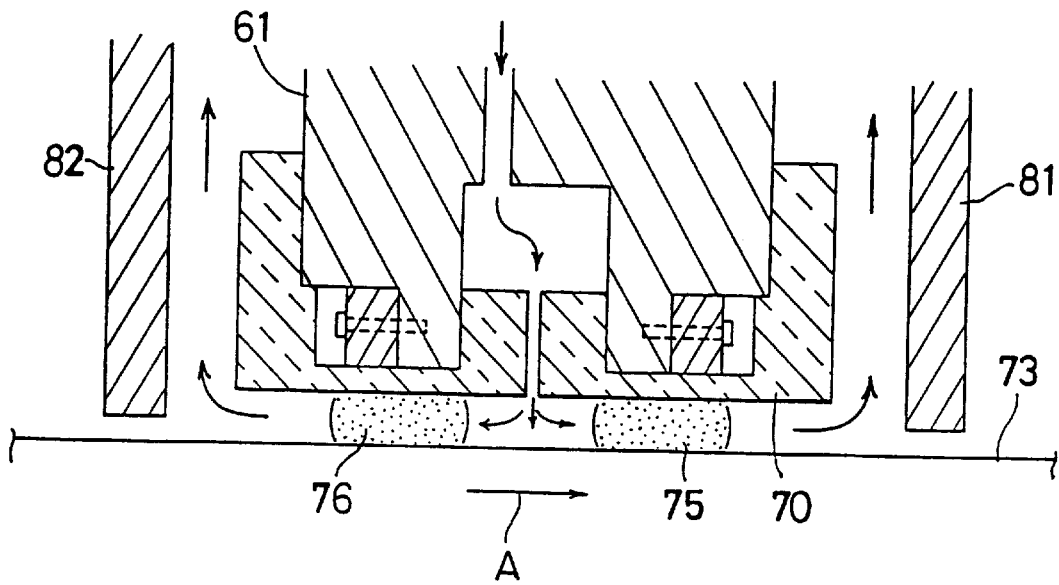
FIG. 9 is a sectional diagram for illustrating the exhaust configuration of a sixth embodiment of the present invention, namely, yet another surface treatment embodying the present invention.

FIG. 9 illustrates the configuration of another example of an exhaust mechanism for use in the surface treatment apparatus of the present invention. In the case of this embodiment, a pair of first partition walls 81 and 82, each of which extends vertically, are placed at downstream and upstream sides of the electrode (the second electrode) 61 along the direction A of the movement of the work 73 placed on a first electrode (not shown) at certain intervals from the work, in such a way as to define an upward exhaust passage therebetween over the full-length thereof. Both of the partition walls 81 and 82 are formed so that a space between the surface of the work 73 and the bottom end of each of the walls 81 and 82 is narrower than the gap between the dielectric 70 and the surface of the work 73. Therefore, the exhaust gas outputted from the discharge regions 75 and 76 are guided into the exhaust passage without flowing into the air. Moreover, it is hard for air to enter the mechanism from the exterior. As a result of configuring the mechanism so that the gas is exhausted from the vicinity of the discharge region, the exhaust mechanism can be miniaturized. Moreover, ozone generated by the electric discharge can be prevented from being emitted into the air. Furthermore, air can be prevented from being mixed into the discharge region. Thereby, the stability of the electric discharge can be enhanced. Further, if there is substantially no drawing of air resulting from an opening between the surface of the work 73 and each of the partition walls 81 and 82 in the configuration of FIG. 9, the directions of intake and exhaust of the discharge gas can be reversed.

Figure 10:
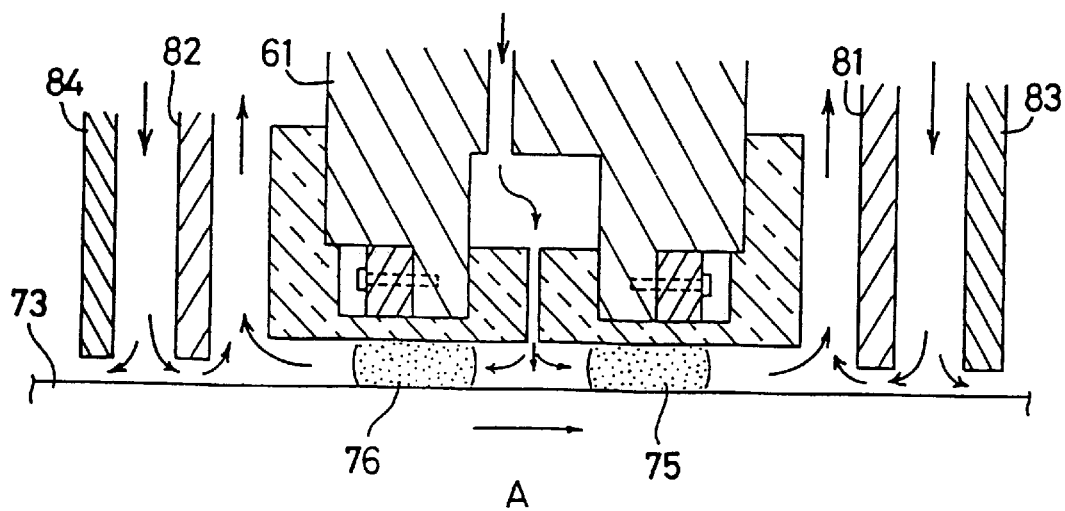
FIG. 10 is a sectional diagram for illustrating an example of a modification of the exhaust configuration of FIG. 9.

FIG. 10 illustrates the configuration of an example of the exhaust mechanism of FIG. 9. In the case of this embodiment, a pair of two partition walls 83 and 84 are placed outside the pair of the first partition walls 81 and 82 in such a way as to be apart at a certain distance. This mechanism is configured so that a gas including helium is supplied from above to the surface of the work in a space between the second partition walls 83 and 84, which are adjacent to the first partition walls 81 and 82, respectively. As a result of providing exhaust passages at both of upstream and downstream sides of the electrode 61 and providing a gas curtain composed of, for example, helium gas, outside the exhaust passages, the air can be further securely prevented from being mixed in the discharge regions 75 and 76.

Figure 11:
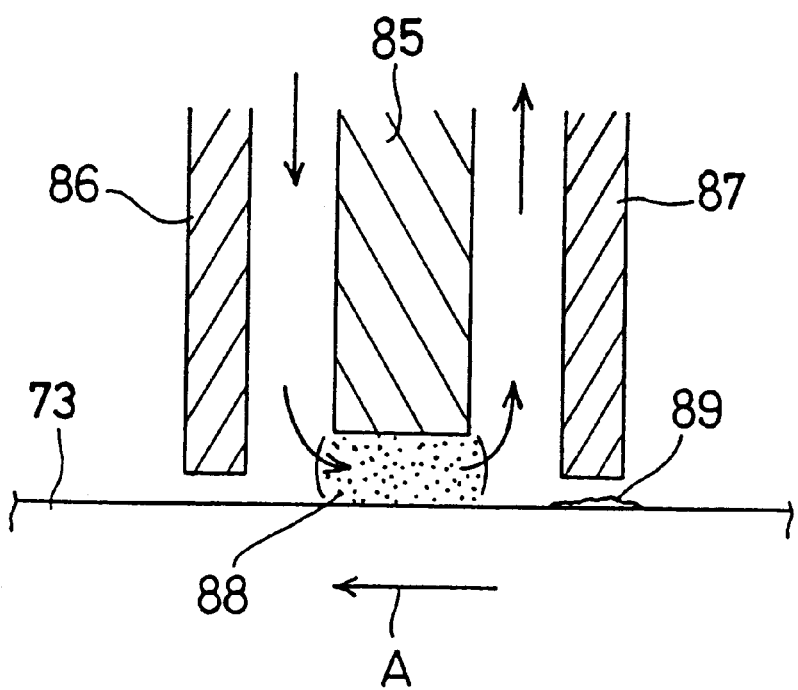
FIG. 11 is a sectional diagram for illustrating another example of the modification of the exhaust configuration of FIG. 9.
Figure 12:
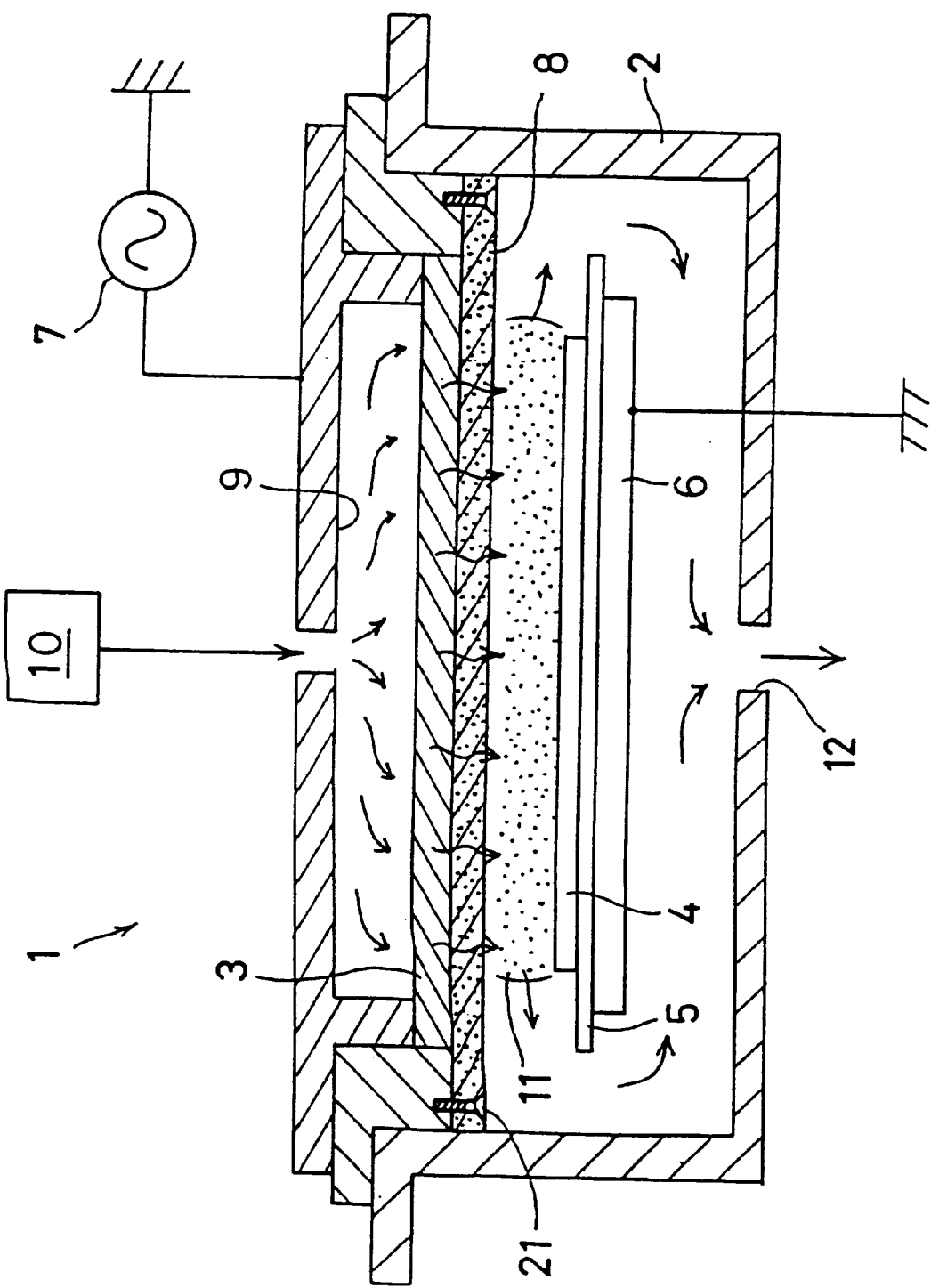
FIG. 12 is a sectional diagram for illustrating the configuration of a conventional surface treatment apparatus of the opposed-face type.
Figure 13:
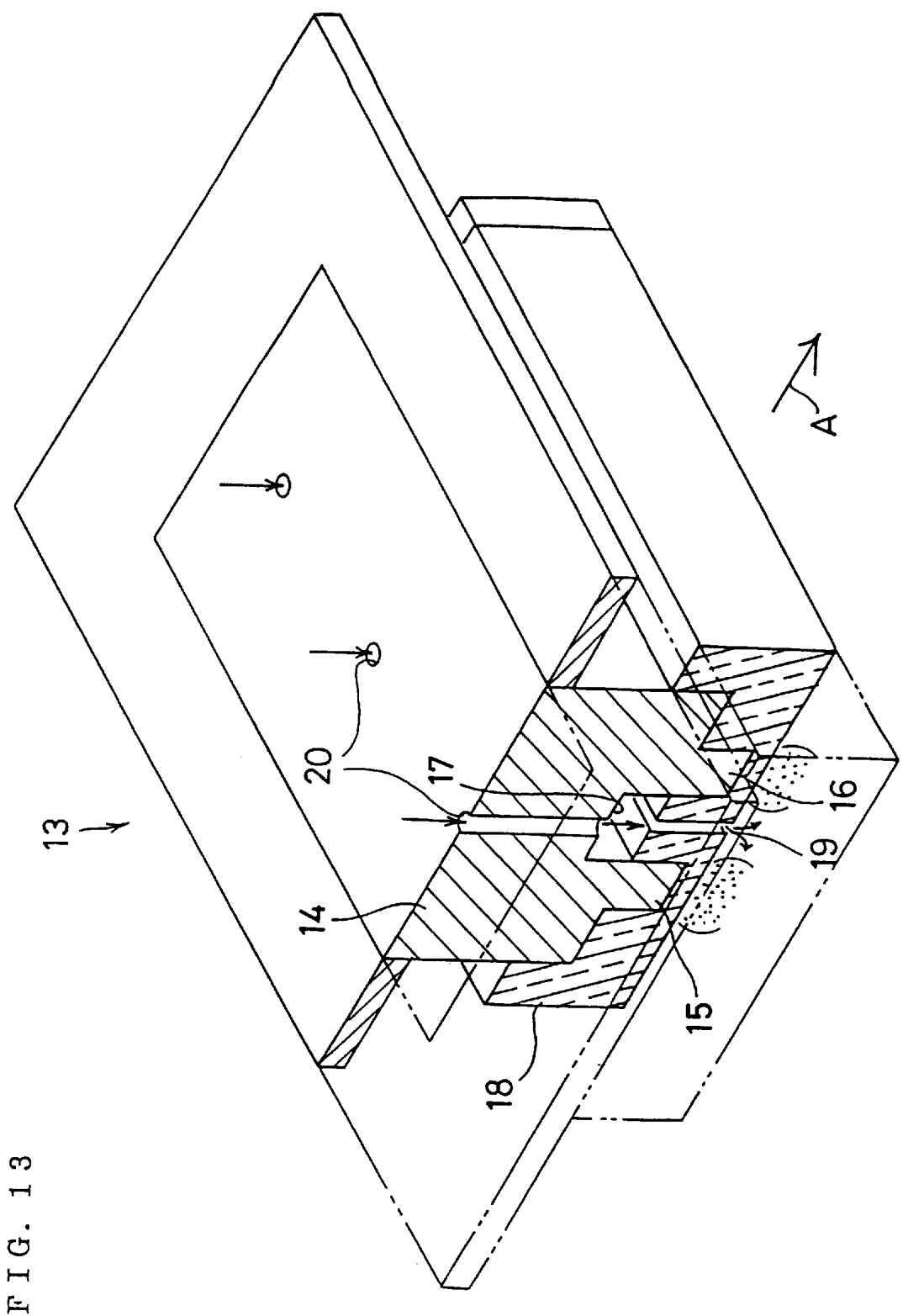
FIG. 13 is a sectional diagram for illustrating the configuration of a conventional surface treatment apparatus of the line type.

The exhaust mechanisms described with reference to FIGS. 9 and 10 can be applied to the case that surface treatment is performed on the work 73 by directly causing an electric discharge between the electrode 85 and the work 73, which perform relative motions as illustrated in FIG. 11. In this case, partition walls 86 and 87 are placed at upstream and downstream sides of the electrode 85, respectively, along the direction A of the movement of the work 73 in such a manner that these walls define the gas supply passage and the gas exhaust passage, respectively, and that a gap between the surface of the work and the bottom end of each of these walls becomes narrower than the gap between the electrode 85 and work 73. At that time, one of these passages, which corresponds to the downstream side of the electrode with respect to the direction A of the movement of the work 73, is the gas supply passage. Further, the other passage corresponding to the upstream side thereof is the gas exhaust passage. Namely, the discharge gas is supplied to the discharge region 88 from the downstream side of the electrode and is exhausted from upstream side thereof. Therefore, there are concerns that air will be mixed in the discharge region from the opening between the partition wall 87 of the gas exhaust passages and the surface of the work 73 and that organic substances or the like, which had been removed, are deposited onto the surface of the work 73 at the upstream side of the electrode. However, such redeposited organic substances 89 are treated again when the work 73 moves and passes through the discharge region 88. Moreover, in the case of this embodiment, when the surface treatment is performed by making the work 73 move there and back under the electrode 85, the direction in which the discharge gas is supplied may be changed according to the direction of the movement of the work 73.

In the foregoing description, the preferable embodiments of the present invention have been described in detail by referring to the accompanying drawings. However, as is obvious to those skilled in the art, the present invention may be practiced by making various changes in and modification to the embodiments within the scope of the present invention. For example, the auxiliary grounded electrode configuration for preventing the work or the like from being damaged owing to an abnormal discharge, which is illustrated in FIG. 4, can be similarly applied not only to the surface treatment apparatus of the opposed-face type of FIG. 5 but also to the surface treatment apparatus of the line type and various surface treatment apparatuses having the electrode configurations.

Figure 16:
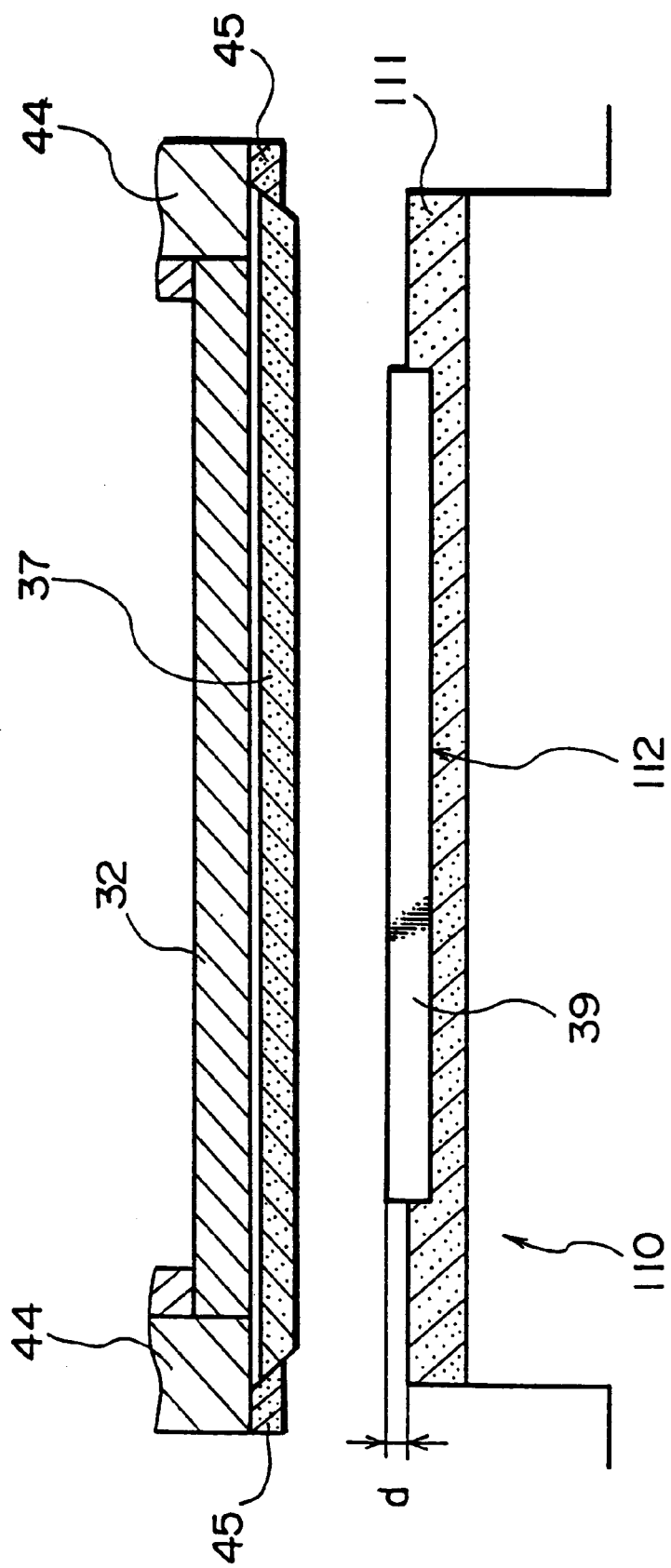
FIG. 16 is a schematic sectional diagram for illustrating an example of a modification of the electrode of FIG. 1, on which a work is placed.

Further, the electrode portion of FIG. 1 on which the work 39 is placed may have the configuration of FIG. 16. In the configuration of FIG. 16, a dielectric 111 is placed on a grounded electrode 110. A concave portion 112, which can contain the work 39, is formed in this dielectric 111. As a result of forming this concave portion 112, the difference-in-level distance d from the surface of the dielectric 111 to the surface of the work 39 can be made to be smaller than the thickness of the work 39.

Thus, the frequency of occurrences of an abnormal discharge, which is liable to occur in the outer edge portion of the work 39, can be reduced. Incidentally, the depth of the concave portion 112 may be set in such a manner as to be nearly equal to the thickness of the work 39, so that the difference-in-level distance d becomes nearly zero.

What is claimed is:

1. A surface treatment apparatus for treating a surface of a workpiece by causing an electric discharge in a discharge region under substantially atmospheric pressure through use of a predetermined gas and by exposing active species which are excited by the electric discharge to the workpiece, comprising:

an electrode having holes through which the predetermined gas passes, for causing the electric discharge within a discharge region;

a porous dielectric placed in such a manner as to be adjacent to an electrode face of the electrode, which faces the discharge region; and a supporting member having a supporting face, by which an outer periphery portion of the porous dielectric is supported, and permitting the dielectric to have a thermal expansion deformation which is associated with a rising temperature due to the electric discharge, on the supporting face.

2. The surface treatment apparatus according to claim 1, wherein the electrode and the porous dielectric are positioned horizontally, wherein the supporting face of the supporting member is an upward inclined-face and wherein a downward inclined-face is formed on the outer periphery portion of the porous dielectric in such a way as to slidably come in contact with the supporting face.

3. The surface treatment apparatus according to claim 2, wherein the supporting member is adapted to be vertically movable with movement of the thermal expansion deformation of the porous dielectric.

4. The surface treatment apparatus according to claim 1, wherein the electrode and the porous dielectric are placed horizontally, and wherein the supporting face of the supporting member is a horizontal face that is in slidable contact with the lower surface of the outer periphery portion of the porous dielectric.

5. A surface treatment apparatus for treating a surface of a workpiece by causing an electric discharge in a discharge region under substantially atmospheric pressure through use of a predetermined gas and by exposing active species which are excited by the electric discharge to the workpiece, comprising:

an electrode for causing the electric discharge within the discharge region;

a dielectric which is adapted to cover the electrode and is positioned in such a manner as to face the discharge region; and a supporting member for supporting the dielectric, wherein the supporting member supports the dielectric to allow expansion of the dielectric in a direction in which the dielectric causes a thermal expansion deformation associated with a rise in temperature due to the electric discharge.

6. A surface treatment apparatus for treating a surface of a workpiece by causing an electric discharge in a discharge region under substantially atmospheric pressure through use of a predetermined gas and by exposing active species which are excited by the electric discharge to the workpiece comprising:

an electrode which has gas exhaust holes, for causing the electric discharge within the discharge region;

a porous dielectric placed in such a manner as to be adjacent to a first electrode face of the electrode, which faces the discharge region;

a plurality of gas inlets each for introducing a predetermined gas from surroundings of the discharge region to the discharge region between the porous dielectric and the workpiece wherein the gas exposed to the workpiece is exhausted by being caused to pass through the porous dielectric and the electrode; and an exhaust catalyst placed adjacent to a second face of the electrode which is opposite to the first electrode face of the electrode.

7. A surface treatment apparatus for treating a surface of a workpiece by exposing active species excited in a discharge region when moving the workpiece with respect to the discharge region, produced under substantially atmospheric pressure comprising:

a first electrode adapted to move when a workpiece is placed thereon;

a second electrode, which is formed in such a manner as to have a first width along a direction of movement of the first electrode and to extend by setting a direction orthogonal to the direction of movement of the first electrode as a longitudinal direction thereof, for producing the discharge region; and auxiliary electrode portions being detachably attached to the second electrode and having a second width along the direction of movement of the first electrode, wherein a range of the discharge region can be adjusted by attaching and detaching the second electrode.

8. The surface treatment apparatus according to claim 7, wherein the auxiliary electrode portions can be partly attached to the second electrode in the longitudinal direction.

9. The surface treatment apparatus according to claim 8, wherein the auxiliary electrode portions can be attached to both longitudinal end portions of the second electrode, respectively.

10. The surface treatment apparatus according to claim 9, wherein the auxiliary electrode portions can be attached to the second electrode in the longitudinal direction over the full-length of the second electrode.

11. A surface treatment apparatus for treating a surface of a workpiece by exposing active species excited in a discharge region when moving the workpiece with respect to a discharge region, produced under substantially atmospheric pressure comprising:

a first electrode adapted to move when a workpiece is placed thereon; and a second electrode, extending in a direction orthogonal to the direction of the movement of the first electrode as a longitudinal direction thereof, for producing the discharge region, wherein the second electrode has:

an intermediate chamber which is formed along the longitudinal direction and to which a gas to be supplied to the discharge region is introduced;

at least one gas inlet through which the gas is introduced into the intermediate chamber; and a gas ejecting port, formed like a slit extending along the longitudinal direction, for ejecting the gas which is contained in the intermediate chamber to the discharge region, wherein at least the single gas inlet is opened at a position deviated from the prolonged line of the gas ejecting port.

12. The surface treatment apparatus according to claim 11, wherein the intermediate chamber has two opposite side walls and a bottom wall in which the gas ejecting port is opened, wherein at least a gas inlet is opened in one of the side walls.

13. The surface treatment apparatus according to claim 11, which further comprises a dielectric for covering an electrode surface of the second electrode, which faces the discharge region, and wherein the intermediate chamber is formed between the second electrode and the dielectric, the gas ejecting port being formed in the dielectric.

14. A surface treatment apparatus for treating a surface of a workpiece by exposing active species excited in a discharge region when moving the workpiece with respect to the discharge region produced under substantially atmospheric pressure comprises:

a first electrode adapted to move when a workpiece is placed thereon;

a second electrode, extending in a direction orthogonal to the direction of the movement of the first electrode as a longitudinal direction thereof and has a gas ejecting port for ejecting gas along the longitudinal direction, for producing the discharge region; and a first extension member, which is provided at an upstream side of the second electrode in the direction of the movement, for forming a gap with said workpiece which is substantially equivalent to a gap between the second electrode and the workpiece.

15. The surface treatment apparatus according to claim 14, which further comprises a second extension member which is provided at a downstream side of the second electrode in the direction of the movement and forming a second gap with said workpiece, which is substantially equivalent to the gap between the second electrode and the workpiece.

16. A surface treatment apparatus for treating a surface of a workpiece by exposing active species excited in a discharge region when moving the workpiece with respect to the discharge region produced under substantially atmospheric pressure comprises:

- a first electrode adapted to move horizontally when a workpiece is placed thereon;
- a second electrode, extending in a direction orthogonal to the direction of movement of the first electrode as a longitudinal direction thereof and has a gas ejecting port for ejecting gas along the longitudinal direction, for producing the discharge region; and
- a pair of first partition walls which are respectively placed at upstream and downstream sides of the second electrode in the direction of movement and are disposed in such a manner as to vertically extend so that a gap is interposed between the second electrode and each of the first partition walls,
- wherein the gas exposed to the workpiece is exhausted through the gaps, each of which is disposed between the second electrode and a corresponding one of the first partition walls.

17. The surface treatment apparatus according to claim 16, comprising a pair of second partition walls, each of the second partition walls parallel with and outside a corresponding one of the first partition walls, wherein a gas is introduced into a gap between each pair of the first and second partition walls which correspond to and face each other, such that gas curtains for separating the discharge region from the air are formed at both sides of the discharge region, respectively.

18. A surface treatment apparatus for treating a surface of a workpiece by exposing active species excited in a discharge region when moving the workpiece with respect to a discharge region produced under substantially atmospheric pressure comprising:

- a first electrode adapted to horizontally move when a workpiece is placed thereon;
- a second electrode, which is placed at a position opposite to a movement path of the first electrode, in such a manner as to extend vertically, for producing the discharge region between the first and second electrodes; and
- a first partition wall that is placed at an upstream side of the second electrode in the direction of the movement in such a manner as to extend vertically, and to form a space which is used for introducing the discharge region, between the second electrode and the first partition wall; and a second partition wall that is placed at a downstream side of the second electrode, in the direction of the movement, in such a manner as to extend vertically, and to form a space which is used for exhausting a gas from the discharge region, between the second electrode and the second partition wall.

* * * * *